US012812860B2

(12) United States Patent
Larsen et al.

(10) Patent No.: US 12,812,860 B2
(45) Date of Patent: Nov. 24, 2026

(54) THREE-DIMENSIONAL MEMORY ARRAY FORMATION TECHNIQUES

(71) Applicant: Micron Technology, Inc., Boise, ID (US)

(72) Inventors: Christopher J. Larsen, Boise, ID (US); S M Istiaque Hossain, Boise, ID (US); David A. Daycock, Boise, ID (US); Kevin R. Gast, Boise, ID (US); George Matamis, Eagle, ID (US); Lingyu Kong, Singapore (SG); Sok Han Wong, Singapore (SG); Lhaang Chee Ooi, Singapore (SG); Wenjie Li, Singapore (SG)

(73) Assignee: Micron Technology, Inc., Boise, ID (US)

( * ) Notice: Subject to any disclaimer, the term of this patent is extended or adjusted under 35 U.S.C. 154(b) by 420 days.

(21) Appl. No.: 18/525,362

(22) Filed: Nov. 30, 2023

(65) Prior Publication Data

US 2024/0188299 A1 Jun. 6, 2024

Related U.S. Application Data

(60) Provisional application No. 63/386,233, filed on Dec. 6, 2022.

(51) Int. Cl.

*H10B 43/27* (2023.01)
*G11C 16/04* (2006.01)
*H10B 43/10* (2023.01)
*H10B 43/35* (2023.01)

(52) U.S. Cl.

CPC ......... *H10B 43/27* (2023.02); *G11C 16/0483* (2013.01); *H10B 43/10* (2023.02); *H10B 43/35* (2023.02)

(58) Field of Classification Search

CPC ......... H10B 43/27; H10B 43/10; H10B 43/35

See application file for complete search history.

(56) References Cited

U.S. PATENT DOCUMENTS

2020/0335509 A1* 10/2020 Yang ...................... H10B 69/00

* cited by examiner

*Primary Examiner* — Errol V Fernandes
(74) *Attorney, Agent, or Firm* — Holland & Hart LLP

(57) ABSTRACT

Methods, systems, and devices for three-dimensional memory array formation techniques are described. A memory device may include a stack of materials over a substrate. The memory device may include an array of first pillars and an array of second pillars extending at least partially through the stack of materials. One or more first pillars may be excluded from one or more columns of pillars of the array first pillars. The memory device may include dielectric material in a slit extending at least partially through the stack of materials. Based on the exclusion of the one or more first pillars, the slit may have a greater width at a first portion through the stack of materials than a second portion through the stack of materials. The dielectric material located in the slit may also have a greater width at the first portion than at the second portion.

19 Claims, 7 Drawing Sheets

THREE-DIMENSIONAL MEMORY ARRAY FORMATION TECHNIQUES

CROSS REFERENCE

The present Application for Patent claims the benefit of U.S. Provisional Patent Application No. 63/386,233 by LARSEN et al., entitled "THREE-DIMENSIONAL MEMORY ARRAY FORMATION TECHNIQUES," filed Dec. 6, 2022, assigned to the assignee hereof, and expressly incorporated by reference herein.

FIELD OF TECHNOLOGY

The following relates to one or more systems for memory, including three-dimensional memory array formation techniques.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read (e.g., sense, detect, retrieve, identify, determine, evaluate) the state of one or more memory cells within the memory device. To store information, a component may write (e.g., program, set, assign) one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be described in terms of volatile configurations or non-volatile configurations. Volatile memory cells (e.g., DRAM) may lose their programmed states over time unless they are periodically refreshed by an external power source. Non-volatile memory cells (e.g., NAND) may maintain their programmed states for extended periods of time even in the absence of an external power source.

DETAILED DESCRIPTION

Figure 1:
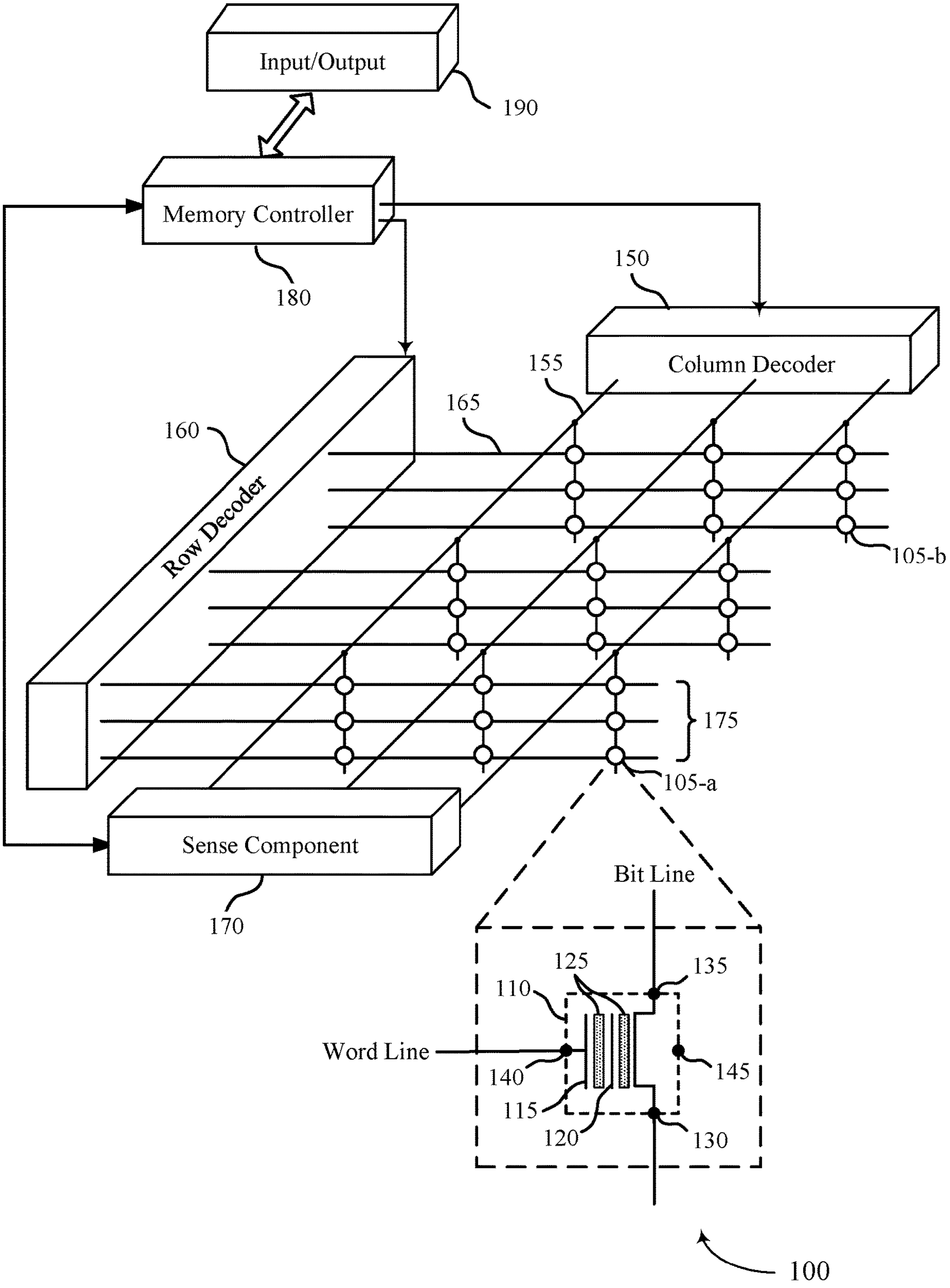
FIG. 1 illustrates an example of a system that supports three-dimensional memory array formation techniques in accordance with examples as disclosed herein.

Memory devices may implement memory architectures (e.g., three-dimensional (3D) architectures) that include various arrangements of memory arrays and supporting circuitry formed over (e.g., directly over, over one or more materials or layers, in contact with) a substrate. For example, a memory device may include 3D arrays of memory cells that are arranged in respective levels (e.g., layers, decks, tiers) of memory cells. The memory device may further include a first array of first pillars (e.g., dummy pillars) and a second array of second pillars (e.g., pillars associated with accessing the memory cells), where the first pillars, or the second pillars, or both may be associated with providing structural support for the memory device. In some cases, as part of forming the memory device, an etch operation may be performed to form a slit (e.g., a trench, a cavity) at least partially through a stack of layers in which the first array and the second array are formed. The slit may be used to support forming different structures (e.g., word lines for accessing the memory cells associated with the second pillars) at one or more respective levels of the memory device. For example, the slit may enable manufacturing operations (e.g., etch operations, deposition operations, and the like) to reach (e.g., access) the levels of the memory device.

However, in some examples, the etch operation may etch a portion of the slit beyond an intended region (e.g., that portion of the slit may extend beyond an intended profile of the slit), which may result in unintentionally removing a corresponding portion of the stack of layers such that one or more of pillars (e.g., dummy pillars) are inadvertently at least partially exposed, contacted, or otherwise affected. The unintentional extension of the slit beyond the intended profile may be referred to as clipping. In some instances, one or more subsequent deposition operations using the slit may result in unwanted conductive material deposited in the portion of the slit, which may cause shorting to occur between structures at different levels (e.g., word line-to-word line shorting) of the memory device, among other issues. In some examples, unwanted conductive material may be in contact with one or more exposed first pillars and a respective access line at different levels, thereby shorting together access lines via the exposed first pillars.

In accordance with examples disclosed herein, a memory device may be formed such that clipping may be eliminated or significantly reduced, while maintaining adequate structural support for the memory device. For example, an array of pillars, such as dummy pillars, may be formed such that one or more pillars, such as one or more dummy pillars, are excluded from the array near (e.g., adjacent to) a portion of the slit where clipping may be likely to occur, thereby preventing such pillars from being exposed when they may have been otherwise as a result of clipping. In some examples, excluding the one or more pillars, such as the dummy pillars, may be performed by refraining from initially forming the one or more first pillars when forming the first array (e.g., by removing the one or more first pillars from a pillar patterning), or by selectively removing the one or more first pillars after forming the first array (e.g., via one or more additional etch operations). In some cases, exclusion of pillars, such as the dummy pillars, may reduce a structural integrity of the memory device. To compensate for this reduction, the slit may be selectively widened (e.g., in a direction different than, such as perpendicular, to the slit profile), for example, at and/or near the portion of the slit where clipping may be likely to occur to mitigate risk of collapse or cantilever bending that may be associated with excluding the one or more dummy pillars from the array. For example, by selectively widening slit near where pillars, such as dummy pillars, are excluded from the array, a dielectric material subsequently deposited in the slit may provide additional structural stability to the memory device (e.g., due to widened slit accommodating a greater quantity of dielectric material to be deposited), while the absence of the one or more dummy pillars may prevent shorting that results from clipping, among other advantages.

Features of the disclosure are initially described in the context of a memory device and a memory architecture as described with reference to FIGS. 1 and 2. Features of the disclosure are described in the context of manufacturing operations and memory architectures with reference to FIGS. 3A through 4. These and other features of the disclosure are further illustrated by and described in the context of a flowchart that relates to three-dimensional memory array formation techniques with reference to FIG. 5.

FIG. 1 illustrates an example of a memory device 100 that supports three-dimensional memory array formation techniques in accordance with examples as disclosed herein. FIG. 1 is an illustrative representation of various components and features of the memory device 100. As such, the components and features of the memory device 100 are shown to illustrate functional interrelationships, and not necessarily physical positions within the memory device 100. Further, although some elements included in FIG. 1 are labeled with a numeric indicator, some other corresponding elements are not labeled, even though they are the same or would be understood to be similar, in an effort to increase visibility and clarity of the depicted features.

The memory device 100 may include one or more memory cells 105, such as memory cell 105-*a* and memory cell 105-*b*. In some examples, a memory cell 105 may be a NAND memory cell, such as in the blow-up diagram of memory cell 105-*a*. Each memory cell 105 may be programmed to store a logic value representing one or more bits of information. In some examples, a single memory cell 105—such as a memory cell 105 configured as a single-level cell (SLC)—may be programmed to one of two supported states and thus may store one bit of information at a time (e.g., a logic 0 or a logic 1). In some other examples, a single memory cell 105—such a memory cell 105 configured as a multi-level cell (MLC), a tri-level cell (TLC), a quad-level cell (QLC), or other type of multiple-level memory cell 105—may be programmed to one state of more than two supported states and thus may store more than one bit of information at a time. In some cases, a multiple-level memory cell 105 (e.g., an MLC memory cell, a TLC memory cell, a QLC memory cell) may be physically different than an SLC cell. For example, a multiple-level memory cell 105 may use a different cell geometry or may be fabricated using different materials. In some examples, a multiple-level memory cell 105 may be physically the same or similar to an SLC cell, and other circuitry in a memory block (e.g., a controller, sense amplifiers, drivers) may be configured to operate (e.g., read and program) the memory cell as an SLC cell, or as an MLC cell, or as a TLC cell, etc.

In some NAND memory arrays, each memory cell 105 may be illustrated as a transistor that includes a charge trapping structure (e.g., a floating gate, a replacement gate, a dielectric material) for storing an amount of charge representative of a logic value. For example, the blow-up in FIG. 1 illustrates a NAND memory cell 105-*a* that includes a transistor 110 (e.g., a metal-oxide-semiconductor (MOS) transistor) that may be used to store a logic value. The transistor 110 may include a control gate 115 and a charge trapping structure 120 (e.g., a floating gate, a replacement gate), where the charge trapping structure 120 may, in some examples, be between two portions of dielectric material 125. The transistor 110 also may include a first node 130 (e.g., a source or drain) and a second node 135 (e.g., a drain or source). A logic value may be stored in transistor 110 by storing (e.g., writing) a quantity of electrons (e.g., an amount of charge) on the charge trapping structure 120. An amount of charge to be stored on the charge trapping structure 120 may depend on the logic value to be stored. The charge stored on the charge trapping structure 120 may affect the threshold voltage of the transistor 110, thereby affecting the amount of current that flows through the transistor 110 when the transistor 110 is activated (e.g., when a voltage is applied to the control gate 115, when the memory cell 105-*a* is read). In some examples, the charge trapping structure 120 may be an example of a floating gate or a replacement gate that may be part of a 2D NAND structure. For example, a 2D NAND array may include multiple control gates 115 and charge trapping structures 120 arranged around a single channel (e.g., a horizontal channel, a vertical channel, a columnar channel, a pillar channel).

A logic value stored in the transistor 110 may be sensed (e.g., as part of a read operation) by applying a voltage to the control gate 115 (e.g., to control node 140, via a word line 165) to activate the transistor 110 and measuring (e.g., detecting, sensing) an amount of current that flows through the first node 130 or the second node 135 (e.g., via a bit line 155). For example, a sense component 170 may determine whether an SLC memory cell 105 stores a logic 0 or a logic 1 in a binary manner (e.g., based on a presence or absence of a current through the memory cell 105 when a read voltage is applied to the control gate 115, based on whether the current is above or below a threshold current). For a multiple-level memory cell 105, a sense component 170 may determine a logic value stored in the memory cell 105 based on various intermediate threshold levels of current when a read voltage is applied to the control gate 115, or by applying different read voltages to the control gate and evaluating different resulting levels of current through the transistor 110, or various combinations thereof. In one example of a multiple-level architecture, a sense component 170 may determine the logic value of a TLC memory cell 105 based on eight different levels of current, or ranges of current, that define the eight potential logic values that could be stored by the TLC memory cell 105.

An SLC memory cell 105 may be written by applying one of two voltages (e.g., a voltage above a threshold or a voltage below a threshold) to memory cell 105 to store, or not store, an electric charge on the charge trapping structure 120 and thereby cause the memory cell 105 store one of two possible logic values. For example, when a first voltage is applied to the control node 140 (e.g., via a word line 165) relative to a bulk node 145 (e.g., a body node) for the transistor 110 (e.g., when the control node 140 is at a higher voltage than the bulk), electrons may tunnel into the charge trapping structure 120. Injection of electrons into the charge trapping structure 120 may be referred to as programming the memory cell 105 and may occur as part of a write operation. A programmed memory cell may, in some cases, be considered as storing a logic 0. When a second voltage is applied to the control node 140 (e.g., via the word line 165) relative to the bulk node 145 for the transistor 110 (e.g., when the control node 140 is at a lower voltage than the bulk node 145), electrons may leave the charge trapping structure 120. Removal of electrons from the charge trapping structure 120 may be referred to as erasing the memory cell 105 and may occur as part of an erase operation. An erased memory cell may, in some cases, be considered as storing a logic 1. In some cases, memory cells 105 may be programmed at a page level of granularity due to memory cells 105 of a page sharing a common word line 165, and memory cells 105 may be erased at a block level of granularity due to memory cells 105 of a block sharing commonly biased bulk nodes 145.

In contrast to writing an SLC memory cell 105, writing a multiple-level (e.g., MLC, TLC, or QLC) memory cell 105 may involve applying different voltages to the memory cell 105 (e.g., to the control node 140 or bulk node 145 thereof) at a finer level of granularity to more finely control the amount of charge stored on the charge trapping structure 120, thereby enabling a larger set of logic values to be represented. Thus, multiple-level memory cells 105 may provide greater density of storage relative to SLC memory cells 105 but may, in some cases, involve narrower read or write margins or greater complexities for supporting circuitry.

A charge-trapping NAND memory cell 105 may operate similarly to a floating-gate NAND memory cell 105 but, instead of or in addition to storing a charge on a charge trapping structure 120, a charge-trapping NAND memory cell 105 may store a charge representing a logic state in a dielectric material between the control gate 115 and a channel (e.g., a channel between a first node 130 and a second node 135). Thus, a charge-trapping NAND memory cell 105 may include a charge trapping structure 120, or may implement charge trapping functionality in one or more portions of dielectric material 125, among other configurations.

In some examples, each page of memory cells 105 may be connected to a corresponding word line 165, and each column of memory cells 105 may be connected to a corresponding bit line 155 (e.g., digit line). Thus, one memory cell 105 may be located at the intersection of a word line 165 and a bit line 155. This intersection may be referred to as an address of a memory cell 105. In some cases, word lines 165 and bit lines 155 may be substantially perpendicular to one another, and may be generically referred to as access lines or select lines.

Accessing memory cells 105 may be controlled through a row decoder 160 and a column decoder 150. For example, the row decoder 160 may receive a row address from the memory controller 180 and activate an appropriate word line 165 based on the received row address. Similarly, the column decoder 150 may receive a column address from the memory controller 180 and activate an appropriate bit line 155. Thus, by activating one word line 165 and one bit line 155, one memory cell 105 may be accessed. As part of such accessing, a memory cell 105 may be read (e.g., sensed) by sense component 170. For example, the sense component 170 may be configured to determine the stored logic value of a memory cell 105 based on a signal generated by accessing the memory cell 105. The signal may include a current, a voltage, or both a current and a voltage on the bit line 155 for the memory cell 105 and may depend on the logic value stored by the memory cell 105. The sense component 170 may include various circuitry (e.g., transistors, amplifiers) configured to detect and amplify a signal (e.g., a current or voltage) on a bit line 155. The logic value of memory cell 105 as detected by the sense component 170 may be output via input/output component 190. In some cases, a sense component 170 may be a part of a column decoder 150 or a row decoder 160, or a sense component 170 may otherwise be connected to or in electronic communication with a column decoder 150 or a row decoder 160.

A memory cell 105 may be programmed or written by activating the relevant word line 165 and bit line 155 to enable a logic value (e.g., representing one or more bits of information) to be stored in the memory cell 105. A column decoder 150 or a row decoder 160 may accept data (e.g., from the input/output component 190) to be written to the memory cells 105. In the case of NAND memory, a memory cell 105 may be written by storing electrons in a charge trapping structure or an insulating layer.

A memory controller 180 may control the operation (e.g., read, write, re-write, refresh) of memory cells 105 through the various components (e.g., row decoder 160, column decoder 150, sense component 170). In some cases, one or more of a row decoder 160, a column decoder 150, and a sense component 170 may be co-located with a memory controller 180. A memory controller 180 may generate row and column address signals in order to activate a desired word line 165 and bit line 155. In some examples, a memory controller 180 may generate and control various voltages or currents used during the operation of memory device 100.

In some cases, a memory device 100 may include a 3D memory array, where multiple two-dimensional (2D) memory arrays may be formed on top of one another. In some examples, such an arrangement may increase the quantity of memory cells 105 that may be fabricated on a single die or substrate as compared with 1D arrays, which, in turn, may reduce production costs, or increase the performance of the memory array, or both. In the example of FIG. 1, memory device 100 includes multiple levels (e.g., decks, layers, planes, tiers) of memory cells 105. The levels may, in some examples, be separated by an electrically insulating material. Each level may be aligned or positioned so that memory cells 105 may be aligned (e.g., exactly aligned, overlapping, or approximately aligned) with one another across each level, forming a memory cell stack 175. In some cases, memory cells 105 aligned along a memory cell stack 175 may be referred to as a string of memory cells 105 (e.g., as described with reference to FIG. 2).

The memory device 100 may include various arrays of pillars to support various functions in the 3D memory array. For example, the memory device 100 may include one or more arrays of dummy pillars and one or more arrays of cell pillars, where the dummy pillars may be used to provide structural support for the memory device 100 and the cell pillars may be used in accessing a respective string of memory cells 105. In some cases, as part of forming the memory device 100, an etch operation may be performed to form a slit (e.g., a trench, a cavity) at least partially through a stack of layers in which the arrays of pillars are formed. The slit may be used to support forming different structures at respective levels of the memory device 100, such as memory cells 105, word lines 165, bit lines 155, conductive structures to couple control circuitry (e.g., a row decoder 160, a column decoder 150, a sense component 170) with access circuitry (e.g., word lines 165, bit lines 155, cell pillars), among other components of the memory device 100.

In accordance with examples described herein, the memory device 100 may be formed such that clipping (e.g., unintentional extension of the slit beyond an intended profile) may be eliminated or reduced, while maintaining adequate structural support for the memory device 100. For example, an array of dummy pillars may be formed such that one or more dummy pillars are excluded from the array near a portion of the slit where clipping may be likely to occur, thereby preventing such dummy pillars from being exposed when they may have been otherwise as a result of clipping. In some cases, exclusion of dummy pillars may reduce a structural integrity of the memory device 100. To compensate for this reduction, the slit may be selectively widened (e.g., in a direction perpendicular to the slit profile), for example, at and/or near the portion of the slit where clipping may be likely to occur to mitigate risk of collapse or cantilever bending that may be associated with excluding the one or more dummy pillars from the array. For example, by selectively widening slit near where the dummy pillars are excluded from the array, a dielectric material subsequently deposited in the slit may provide additional structural stability to the memory device 100 (e.g., due to widened slit accommodating a greater quantity of dielectric material to be deposited), while the absence of the one or more dummy pillars may prevent shorting that results from clipping.

Figure 2:
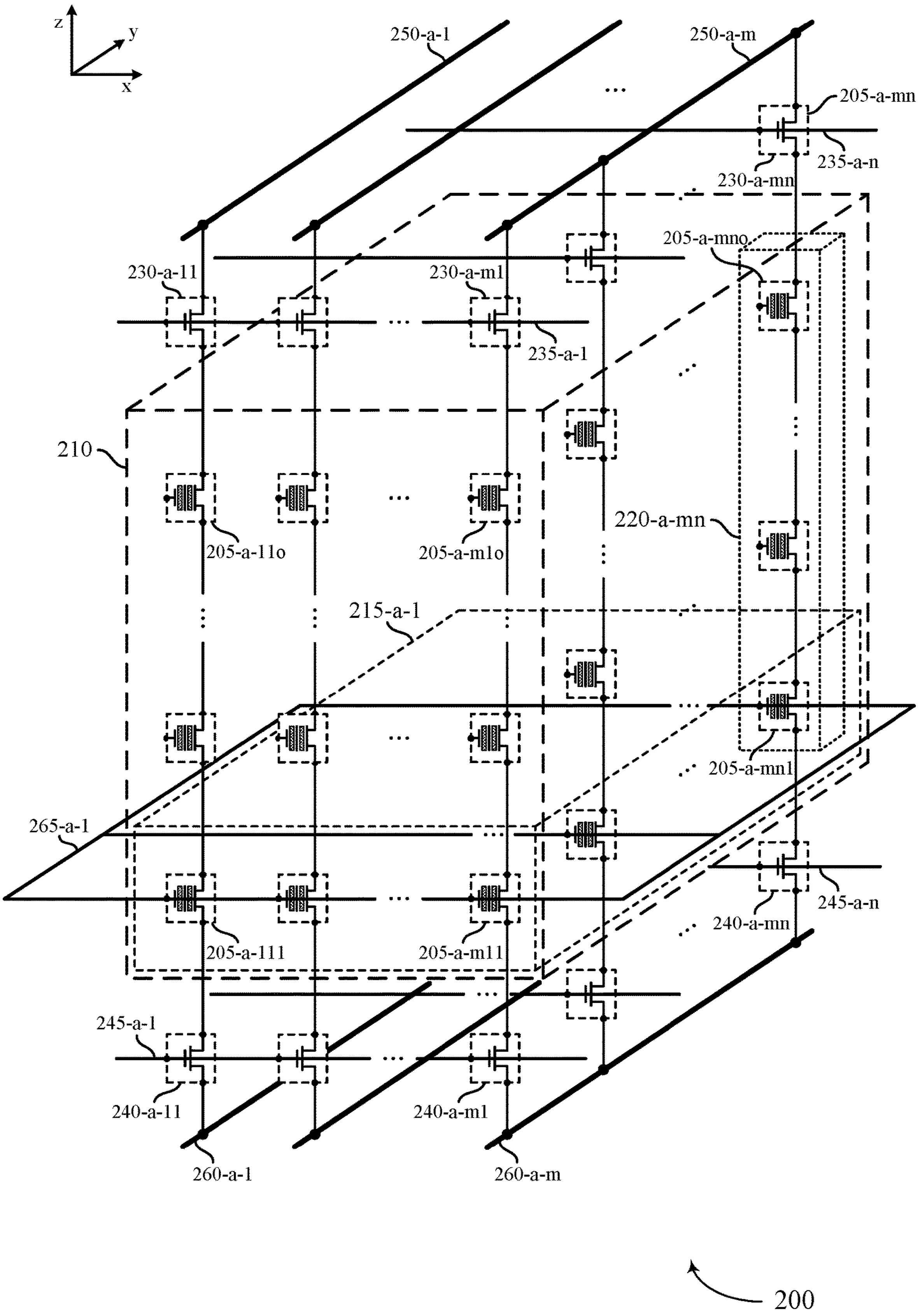
FIG. 2 illustrates an example of a memory architecture that supports three-dimensional memory array formation techniques in accordance with examples as disclosed herein.

FIG. 2 illustrates an example of a memory architecture 200 that supports three-dimensional memory array formation techniques in accordance with examples as disclosed herein. The memory architecture 200 may be an example of a portion of a memory device, such as a memory device 100. Although some elements of a set of elements (e.g., an array of elements) are included in FIG. 2, some elements may be omitted for the sake of visibility and clarity of the depicted elements. Moreover, although some elements included in FIG. 2 are labeled with reference numbers, some other corresponding elements are not labeled, though they are the same or would be understood by a person having ordinary skill in the art to be similar. Aspects of the memory architecture 200 may be described with reference to an x-direction, a y-direction, and a z-direction of the illustrated coordinate system.

The memory architecture 200 includes a 3D array of memory cells 205, which may be examples of memory cells 105 described with reference to FIG. 1 (e.g., transistors 110, NAND memory cells). In some examples, the memory cells 205 may be connected in a 3D NAND configuration. For example, the memory cells 205 may be included in a block 210, which may be arranged as a 3D array of m memory cells along the x-direction, n memory cells along the y-direction, and o memory cells along the z-direction. Each memory cell 205 may be located (e.g., addressed) in accordance with an index i along the x-direction, an index j along the y-direction, and an index k along the z-direction (e.g., for locating a memory cell 205-*a-ijk*). A memory device 100 may include any quantity of one or more blocks 210 in accordance with examples as disclosed herein, and different blocks 210 may be adjacent along the x-direction, along the y-direction, or along the z-direction, or any combination thereof.

In the example of memory architecture 200, the block 210 may be divided into a set of pages 215 (e.g., a quantity of o pages 215) along the z-direction, including a page 215-*a-l* associated with memory cells 205-*a-lll* through 205-*a-mnl*. In some examples, each page 215 may be associated with a same word line 265, (e.g., a word line 165 described with reference to FIG. 1), which may be coupled with a control gate 115 of each of the memory cells 205 of the page 215. For example, page 215-*a-l* may be associated with a word line 265-*a-l*, and other pages 215-*a-i* may be associated with a different respective word line 265-*a-i* (not shown). In some examples, a word line 265 in accordance with the memory architecture 200 may be implemented as planar conductor (e.g., in an xy-plane) that is coupled with each of the memory cells 205 of the page 215.

In the example of memory architecture 200, the block 210 also may be divided into a set of strings 220 (e.g., a quantity of (m×n) strings 220) in an xy-plane, including a string 220-*a-mn* associated with memory cells 205-*a-mnl* through 205-*a-mno*. In some examples, each string 220 may include a set of memory cells 205 connected in series (e.g., along the z-direction, in which a drain of one memory cell 205 in the string 220 may be coupled with a source of another memory cell 205 in the string 220). In some examples, memory cells 205 of a string 220 may be implemented along a common channel, such as a pillar channel (e.g., a columnar channel, a pillar of doped semiconductor) along the z-direction. Each memory cell 205 in a string 220 may be associated with a different word line 265, such that a quantity of word lines 265 in the memory architecture 200 may be equal to the quantity of memory cells 205 in a string 220. Accordingly, a string 220 may include memory cells 205 from multiple pages 215, and a page 215 may include memory cells 205 from multiple strings 220.

In some examples, memory cells 205 may be programmed (e.g., set to a logic 0) value) and read from in accordance with a granularity, such as at the granularity of the page 215, but may not be erasable (e.g., reset to a logic 1 value) in accordance with the granularity, such as the granularity of the page 215. For example, NAND memory may instead be erasable in accordance with a different (e.g., higher) level of granularity, such as at the level of granularity the block 210. In some cases, a memory cell 205 may be erased before it may be re-programmed. Different memory devices may have different read, write, or erase characteristics.

In some examples, each string 220 of a block 210 may be coupled with a respective transistor 230 (e.g., a string select transistor, a drain select transistor) at one end of the string 220 (e.g., along the z-direction) and a respective transistor 240 (e.g., a source select transistor, a ground select transistor) at the other end of the string 220. In some examples, a drain of each transistor 230 may be coupled with a bit line 250 of a set of bit lines 250 associated with the block 210, where the bit lines 250 may be examples of bit lines 155 described with reference to FIG. 1. A gate of each transistor 230 may be coupled with a select line 235 (e.g., a string select line, a drain select line). Thus, a transistor 230 may be used to couple a string 220 with a bit line 250 based on applying a voltage to the select line 235, and thus to the gate of the transistor 230. Although illustrated as separate lines along the x-direction, in some examples, select lines 235 may be common to all the transistors 230 associated with the block 210 (e.g., a commonly biased string select node). For example, like the word lines 265 of the block 210, select lines 235 associated with the block 210 may, in some examples, be implemented as a planar conductor (e.g., in an xy-plane) that is coupled with each of the transistors 230 associated with the block 210.

In some examples, a source of each transistor 240 associated with the block 210 may be coupled with a source line 260 of a set of source lines 260 associated with the block 210. In some examples, the set of source lines 260 may be associated with a common source node (e.g., a ground node) corresponding to the block 210. A gate of each transistor 240 may be coupled with a select line 245 (e.g., a source select line, a ground select line). Thus, a transistor 240 may be used to couple a string 220 with a source line 260 based on applying a voltage to the select line 245, and thus to the gate of the transistor 240. Although illustrated as separate lines along the x-direction, in some examples, select lines 245 also may be common to all the transistors 240 associated with the block 210 (e.g., a commonly biased ground select node). For example, like the word lines 265 of the block 210, select lines 245 associated with the block 210 may, in some examples, be implemented as a planar conductor (e.g., in an xy-plane) that is coupled with each of the transistors 240 associated with the block 210.

To operate the memory architecture 200 (e.g., to perform a program operation, a read operation, or an erase operation on one or more memory cells 205 of the block 210), various voltages may be applied to one or more select lines 235 (e.g., to the gate of the transistors 230), to one or more bit lines 250 (e.g., to the drain of one or more transistors 230), to one or more word lines 265, to one or more select lines 245 (e.g., to the gate of the transistors 240), to one or more source lines 260 (e.g., to the source of the transistors 240), or to a bulk for the memory cells 205 (not shown) of the block 210. In some cases, each memory cell 205 of a block 210 may have a common bulk, the voltage of which may be controlled independently of bulks for other blocks 210.

In some cases, as part of a read operation for a memory cell 205, a positive voltage may be applied to the corresponding bit line 250 while the corresponding source line 260 may be grounded or otherwise biased at a voltage lower than the voltage applied to the bit line 250. In some examples, voltages may be concurrently applied to the select line 235 and the select line 245 that are above the threshold voltages of the transistor 230 and the transistor 240, respectively, for the memory cell 205, thereby activating the transistor 230 and transistor 240 such that a channel associated with the string 220 that includes the memory cell 205 (e.g., a pillar channel) may be electrically connected with (e.g., electrically connected between) the corresponding bit line 250 and source line 260. A channel may be an electrical path through the memory cells 205 in the string 220 (e.g., through the sources and drains of the transistors in the memory cells 205 of the string 220) that may conduct current under some operating conditions.

In some examples, multiple word lines 265 (e.g., in some cases all word lines 265) of the block 210—except a word line 265 associated with a page 215 of the memory cell 205 to be read—may concurrently be set to a voltage (e.g., VREAD) that is higher than the threshold voltage (VT) of the memory cells 205. VREAD may cause all memory cells 205 in the unselected pages 215 be activated so that each unselected memory cell 205 in the string 220 may maintain high conductivity within the channel. In some examples, the word line 265 associated with the memory cell 205 to be read may be set to a voltage, VTarget. Where the memory cells 205 are operated as SLC memory cells, VTarget may be a voltage that is between (i) VT of a memory cell 205 in an erased state and (ii) VT of a memory cell 205 in a programmed state.

When the memory cell 205 to be read exhibits an erased VT (e.g., VTarget>VT of the memory cell 205), the memory cell 205 may turn "ON" in response to the application of VTarget to the word line 265 of the selected page 215, which may allow a current to flow in the channel of the string 220, and thus from the bit line 250 to the source line 260. When the memory cell 205 to be read exhibits a programmed VT (e.g., VTarget<VT of the selected memory cell), the memory cell 205 may remain "OFF" despite the application of VTarget to the word line 265 of the selected page 215, and thus may prevent a current from flowing in the channel of the string 220, and thus from the bit line 250 to the source line 260.

A signal on the bit line 250 for the memory cell 205 (e.g., an amount of current below or above a threshold) may be sensed (e.g., by a sense component 170 as described with reference to FIG. 1), and may indicate whether the memory cell 205 became conductive or remained non-conductive in response to the application of VTarget to the word line 265 of the selected page 215. The sensed signal thus may be indicative of whether the memory cell 205 was in an erased state (e.g., storing a logic 1) or a programmed state (e.g., storing a logic 0). Though aspects of the example read operation above have been explained in the context of an SLC memory cell 205 for clarity, such techniques may be extended or altered and applied in the context of a multiple-level memory cell 205 (e.g., through the use of multiple values of VTarget corresponding to the different amounts of charge that may be stored in one multiple-level memory cell 205).

In some cases, as part of a program operation for a memory cell 205, charge may be added to a portion of the memory cell 205 such that current flow through the memory cell 205, and thus the corresponding string 220, may be inhibited when the memory cell 205 is later read. For example, charge may be injected into a charge trapping structure 120 as shown in memory cell 105-*a* of FIG. 1. In some cases, respective voltages may be applied to the word line 265 of the page 215 and the bulk of the memory cell 205 to be programmed such that a control gate 115 of the memory cell 205 is at a higher voltage than the bulk of the memory cell 205 (e.g., a positive voltage may be applied to the word line). Concurrently, voltages may be applied to the select line 235 and the select line 245 that are above the threshold voltages of the transistor 230 and the transistor 240, respectively, thereby activating the transistor 230 and the transistor 240, and the bit line 250 for the memory cell 205 to be programmed may be set to a relatively high voltage. This may cause an electric field such that electrons are pulled from the source of the memory cell 205 towards the drain. The electric field may also cause some of these electrons to be pulled through dielectric material 125 and thereby injected into the charge trapping structure 120 of the memory cell 205, through a process which may in some cases be referred to as tunnel injection.

In some cases, a single program operation may program some or all memory cells 205 in a page 215, as the memory cells 205 of the page 215 may all share a common word line 265 and a common bulk. For a memory cell 205 of the page 215 for which it is not desired to write a logic 0) (e.g., not desired to program the memory cell 205), the corresponding bit line 250 may be set to a relatively low voltage (e.g., ground), which may inhibit the injection of electrons into a charge trapping structure 120. Though aspects of the example program operation above have been explained in the context of an SLC memory cell 205 for clarity, such techniques may be extended and applied to the context of a multiple-level memory cell 205 (e.g., through the use of multiple programming voltages applied to the word line 265, or multiple passes or pulses of a programming voltage applied to the word line 265, corresponding to the different amounts of charge that may be stored in one multiple-level memory cell 205).

In some cases, as part of an erase operation for a memory cell 205, charge may be removed from a portion of the memory cell 205 such that current flow through the memory cell 205, and thus the corresponding string 220, may be uninhibited (e.g., allowed, at least to a greater extent) when the memory cell 205 is later read. For example, charge may be removed from a charge trapping structure 120 as shown in memory cell 105-*a* of FIG. 1. In some cases, respective voltages may be applied to the word line 265 of the page 215 and the bulk of the memory cell 205 to be erased such that a control gate 115 of the memory cell 205 is at a lower voltage than the bulk of the memory cell 205 (e.g., a positive voltage may be applied to the bulk), which may cause an electric field that pulls electrons out of the charge trapping structure 120 and into the bulk of the memory cell 205. In some cases, a single program operation may erase all memory cells 205 in a block 210, as the memory cells 205 of the block 210 may all share a common bulk.

The memory device 100 may include various arrays of pillars to support various functions in the 3D array of memory cells 205. For example, the memory architecture 200 may include an array of cell pillars used to access memory cells 205 of a string 220. In some examples, the cell pillars may be conductive pillars (e.g., each cell pillar may be a conductive line extending in the z-direction between a transistor 230 and a transistor 240) which may extend through one or more levels of memory cells 205 to couple respective bit lines 250 with the respective levels of memory cells 205. For example, a cell pillar may carry current from the bit line 250 to the memory cells 205 of a corresponding string 220 (e.g., at least a portion of a voltage applied to the bit line 250 may be applied to one or more memory cells 205 of the string 220 via the cell pillar). Additionally, or alternatively, a cell pillar may carry current from one or more components of the memory architecture 200 (e.g., included in or coupled with a string 220) to the bit line 250.

The memory architecture 200 may also include one or more arrays of pillars that provide structural support to the memory architecture 200. In some examples, structural support pillars that are not coupled with any memory cells 205 may be referred to as dummy pillars. Dummy pillars may extend in the z-direction. In some examples, the dummy pillars may be conductive pillars (e.g., formed using a conductive material) but may be insulated from being coupled with control or access circuitry of the memory architecture 200 (e.g., transistors, access lines, and so on).

In some cases, as part of forming the memory architecture 200, an etch operation may be performed to form a slit at least partially through a stack of layers in which the first array and the second array are formed. The slit may be used to support forming various structures at respective levels of the memory architecture 200. For example, the slit may enable manufacturing operations (e.g., etch operations, deposition operations, and the like) to reach the levels of the memory architecture 200. However, in some cases, clipping of the slit may occur such that unwanted shorting between components of the memory architecture 200 may occur (e.g., shorting between word lines 265 at different levels).

In accordance with examples described herein, the memory architecture 200 may be formed such that clipping may be eliminated or reduced, while maintaining adequate structural support for the memory architecture 200. For example, an array of dummy pillars may be formed such that one or more dummy pillars are excluded from the array near a portion of the slit where clipping may be likely to occur, thereby preventing such dummy pillars from being exposed when they may have been otherwise as a result of clipping. In some cases, exclusion of dummy pillars may reduce a structural integrity of the memory architecture 200. To compensate for this reduction, the slit may be selectively widened, for example, at and/or near the portion of the slit where clipping may be likely to occur to mitigate risk of collapse or cantilever bending that may be associated with excluding the one or more dummy pillars from the array. For example, by selectively widening slit near where the dummy pillars are excluded from the array, a dielectric material subsequently deposited in the slit may provide additional structural stability to the memory architecture 200, while the absence of the one or more dummy pillars may prevent shorting that results from clipping.

Figure 3A:
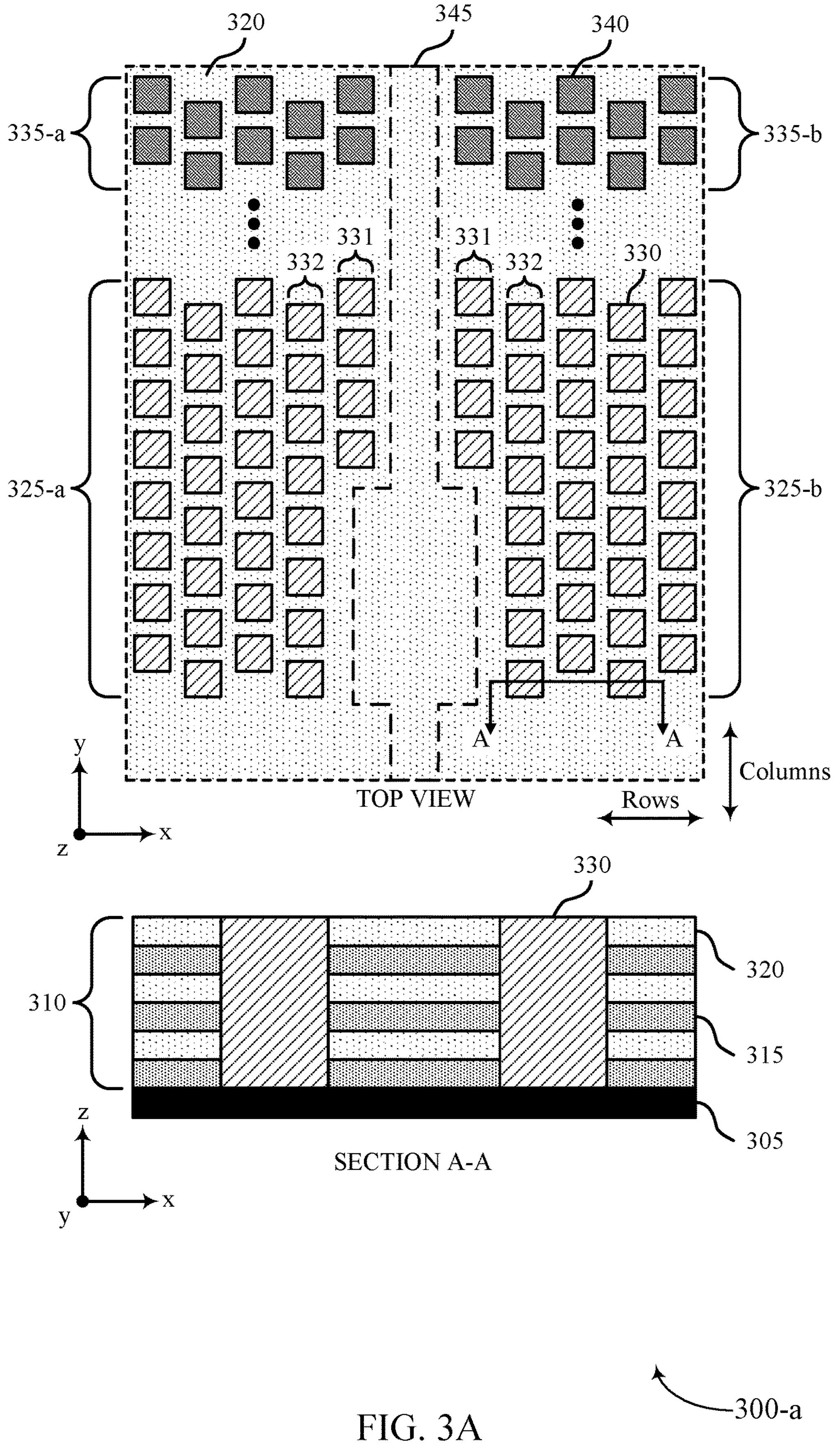
FIGS. 3A, 3B, and 3C illustrate examples of operations of a manufacturing process for a memory architecture that supports three-dimensional memory array formation techniques in accordance with examples as disclosed herein.
Figure 3B:
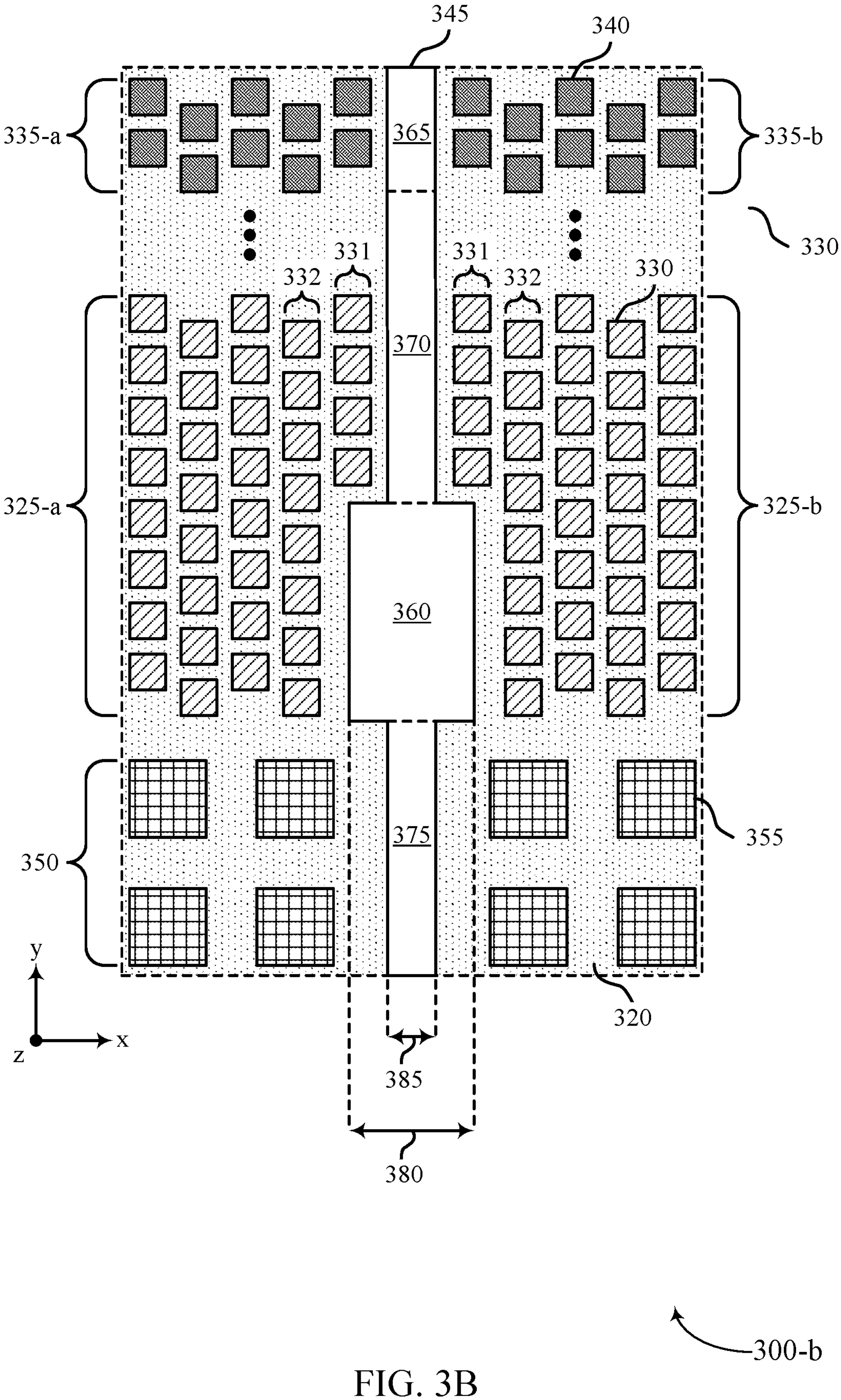
Figure 3C:
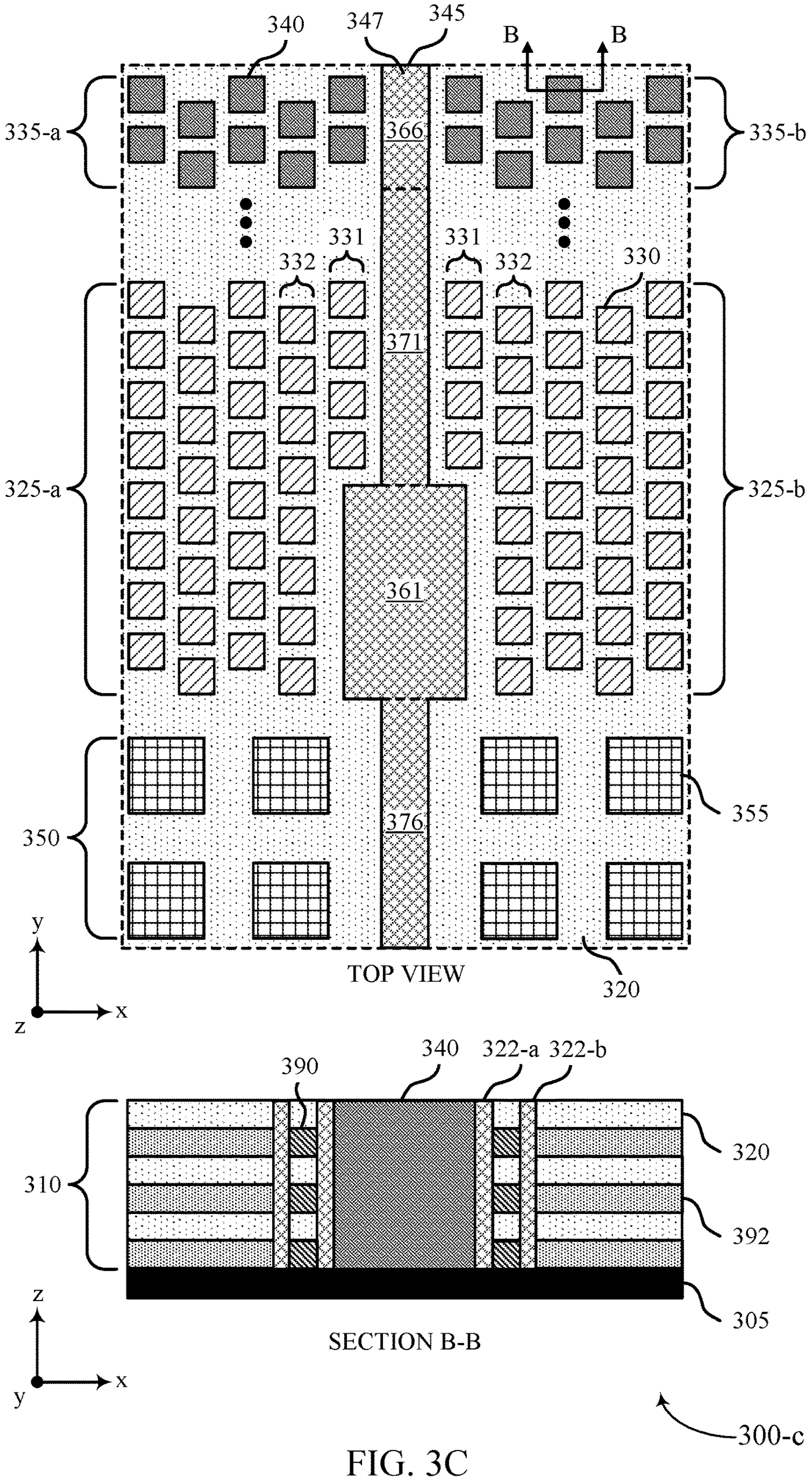

FIGS. 3A through 3C illustrate examples of operations that support three-dimensional memory array formation techniques in accordance with examples as disclosed herein. For example, FIGS. 3A through 3C may illustrate aspects of a sequence of manufacturing operations for fabricating aspects of a layout 300, which may be implemented at a memory device, such as a memory device 100, as described with reference to FIG. 1. Further, the layout 300 may include aspects of a memory architecture 200, as described with reference to FIG. 2. Although some elements of a set of elements (e.g., an array of elements) are included in FIGS. 3A through 3C, some elements may be omitted for the sake of visibility and clarity of the depicted elements. Moreover, although some elements included in FIG. 3A through 3C are labeled with reference numbers, some other corresponding elements are not labeled, though they are the same or would be understood to be similar.

Each view of the FIGS. 3A through 3C may be described with reference to an x-direction, a y-direction, and a z-direction, as illustrated. The manufacturing operations illustrate various views of the layout 300. For example, the manufacturing operations may illustrate top views of the layout 300 in an xy-plane, and cross-sectional views of the layout 300 in an xz-plane. Although the layout 300 illustrates examples of certain relative dimensions and quantities of various features, aspects of the layout 300 may be implemented with other relative dimensions or quantities of such features in accordance with examples as disclosed herein.

Operations illustrated in and described with reference to FIGS. 3A through 3C may be performed by a manufacturing system, such as a semiconductor fabrication system configured to perform additive operations such as deposition or bonding, subtractive operations such as etching, trenching, planarizing, or polishing, and supporting operations such as masking, patterning, photolithography, or aligning, among other operations that support the described techniques. In some examples, operations performed by such a manufacturing system may be supported by a process controller or its components as described herein.

The manufacturing operations described herein may be associated with forming the layout 300 such that clipping (e.g., the effects of clipping) may be reduced or eliminated while maintaining sufficient structural support for the layout 300. For example, the manufacturing operations may include excluding one or more pillars from an array of pillars such that clipping may be avoided. Further, the manufacturing operations may include selectively increasing the width of a portion of a slit near where the one or more pillars are excluded to mitigate risk of collapse or cantilever bending that may be associated with excluding the one or more pillars from the layout 300. In accordance with examples as described herein, excluding the one or more pillars and selectively widening one or more portions of the slit may prevent clipping, thereby preventing shorting (e.g., word line shorting resulting from clipping) while maintaining structural support of the layout 300.

FIG. 3A illustrates a top view and a cross-sectional view (e.g., at Section A-A) of a layout 300-*a* after a first set of one or more manufacturing operations. The first set of manufacturing operations may include forming various structures and materials over a substrate 305. The substrate 305 may be a semiconductor wafer or other substrate over which a stack of layers 310 is formed (e.g., deposited). The stack of layers 310 may include alternating layers of a sacrificial material 315 (e.g., a nitride material) and a dielectric material 320 (e.g., an oxide material), where the layers of sacrificial material 315 and dielectric material 320 may be sequentially (e.g., repeatedly) deposited over the substrate 305 (e.g., directly over, over one material or layer and one or more other materials or layers, in contact with). In some examples, the substrate 305 may be formed as an xy-plane, and the subsequent stack of layers 310 may be formed such that each layer is coplanar to the substrate 305. In some examples, one or more of the layers of sacrificial material 315 may be replaced with one or more other materials at one or more subsequent stages of manufacturing operations.

The first set of manufacturing operations may include forming one or more arrays of pillars. For example, the first set of manufacturing operations may include forming one or more arrays 325 (e.g., an array 325-*a*, an array 325-*b*) of pillars 330, and one or more arrays 335 (e.g., an array 335-*a*, an array 335-*b*) of pillars 340. The pillars 330 and pillars 340 may extend at least partially through the stack of layers 310 in a first direction that is non-parallel to the substrate 305 (e.g., the z-direction). In some cases, forming the arrays of pillars (e.g., arrays 325, arrays 335) may include forming (e.g., etching) respective arrays of cavities at least partially through the stack of layers 310 to be filled with a pillar material. In some examples, the pillar material may be a conductive material for forming conductive pillars. Forming the arrays of cavities may include forming a mask (e.g., a photolithography mask) with a pillar patterning (e.g., a set of holes in the mask via which cavities may be etched). The mask may be deposited over a top surface (e.g., along the z-direction) of the stack of layers 310 and may protect areas of the stack of layers 310 covered (e.g., in the xy-plane) by the mask. Similarly, the pillar patterning of the mask may expose areas (e.g., associated with the pillar patterning) of the stack of layers 310 below the mask (e.g., along the z-direction).

In some cases, the pillar patterning may include rows and columns of holes in the mask. For example, the pillar patterning may include a set of holes extending in a second direction parallel to the substrate 305 (e.g., in the y-direction) and a third direction parallel to the substrate 305 (e.g., in the x-direction). In some examples, the third direction may be perpendicular to the second direction. Subsets of holes in the second direction may correspond to respective columns of pillars, and subsets of holes in the third direction may correspond to respective rows of pillars, as indicated in FIG. 3A. For example, the rows may extend along the x-direction and the columns may extend along the y-direction (e.g., although alternatively, rows may extend along the x-direction and the columns may extend along the y-direction).

The first set of manufacturing operations may include forming the respective arrays of cavities in the stack of layers 310. For example, one or more etch operations may etch cavities in the stack of layers 310 in accordance with the pillar patterning. For instance, the pillar patterning of the mask may not protect the stack of layers 310 from the etch operation (e.g., the set of holes may expose portions of the stack of layers 310), such that the portions of the stack of layers 310 below (e.g., exposed by) the pillar patterning may be etched (e.g., using a dry etch or a wet etch) to form the cavities. The one or more etch operations may form arrays of cavities associated with the arrays 325 of pillars 330 and the arrays 335 of pillars 340. The cavities may be filled with a pillar material. For example, arrays of cavities corresponding to the arrays 325 of pillars 330 may be filled with a first pillar material and arrays of cavities corresponding to the arrays 335 of pillars 340 may be filled with a second pillar material (e.g., pillar material may be deposited into each cavity to form each pillar 330 or 340). In some examples, the first pillar material and the second pillar material may be a conductive material (e.g., same or different conductive materials). In some examples, the first pillar material may be a non-conductive material, and the second pillar material may be a conductive material. In some examples, one or more other materials may be deposited in the cavities (not shown for illustrative clarity), such as one or more dielectric materials, one or more nitride materials (e.g., sacrificial materials), or a combination thereof. For example, one or more other materials may be deposited in cavities corresponding to pillars 340 to support the subsequent formation and accessing of memory cells (e.g., memory cells 390 described with reference to FIG. 3C). In some examples, these other materials may also be deposited in cavities corresponding to pillars 330, for example, to simplify a manufacturing procedure to form the pillars 330 and pillars 340 (e.g., reduce a quantity of manufacturing operations performed to form the pillars 330 and pillars 340, for example, by forming the pillars 330 and pillars 340 via same manufacturing operations).

In some cases, the pillars 330 may be functionally different from the pillars 340. For example, the pillars 330 may be dummy pillars, where the pillars 330 may not be used to access subsequently formed memory cells of the layout 300 (e.g., memory cells 390), and may instead be associated with providing structural support to the layout 300 (e.g., the arrays 335 of pillars 340). The pillars 340 may be associated with accessing the subsequently formed memory cells of the layout 300. In some examples, the pillars 340 may also provide structure support to the layout 300. In some examples, the arrays 325 may be dummy arrays, and the arrays 335 may be associated with (e.g., correspond to) memory arrays. In some cases, there may be some distance (e.g., indicated by the ellipses in FIG. 3A) between the arrays 325 and the arrays 335 (e.g., a space between array 325-*a* and 335-*a*, and between 325-*b* and 335-*b* in the y-direction). Other structures, such as additional pillars 330, additional pillars 340, or other supporting circuitry or materials may be formed in the distance between the arrays 325 and arrays 335. In some cases, the arrays 325 and arrays 335 may be adjacent in the y-direction.

In some cases, the first set of manufacturing operations may include excluding one or more pillars 330 from the arrays 325. For example, one or more pillars 330 may be excluded (e.g., removed) from one or more first columns 331 of the arrays 325, where the first columns 331 may be located on either side (e.g., in x-direction) of an anticipated slit 345 (e.g., which may be formed at a later stage of manufacturing operations, such as described with reference to FIG. 3B). For instance, in the example of FIG. 3A, each column of pillars 330 may include 8 pillars 330. However, the first columns 331 may be formed such that they have a fewer quantity of pillars 330 than pillars 330 included in other columns of the arrays 325 (e.g., second columns 332 of the arrays 325) located to the side (e.g., in the x-direction, away from the anticipated slit 345) of the first columns 331.

In some examples, one or more pillars 330 may be excluded from other columns of the arrays 325 (e.g., one or more pillars 330 may be excluded from one or more of the second columns 332 or other columns of the arrays 325).

In some cases, the one or more pillars 330 may be excluded (e.g., removed) based on anticipating the width of the slit 345, such that the one or more pillars 330 may not be clipped by the slit 345. In some examples, a quantity of pillars 330 to be excluded from the first columns 331 may be determined by identifying a quantity of pillars 330 that may be otherwise clipped by the slit 345 at a later stage of manufacturing. For example, in the example of FIG. 3A, 4 pillars 330 may be identified as likely to be otherwise contacted by (e.g., exposed by) the slit 345, and the 4 pillars 330 may be excluded prior to forming the slit 345. In some instances, the one or more pillars 330 may be selected for exclusion along the y-direction, such that if 4 pillars 330 are identified to be excluded, the 4 pillars 330 may be excluded from the bottom (e.g., along the y-direction) of the first column 331. In some examples, one or more pillars 330 may be excluded from one of the first columns 331 and included the other first column 331.

In some cases, the excluding the one or more pillars 330 from the arrays 325 may include removing the one or more pillars 330 from the pillar patterning, or via an etch operation. For example, the one or more pillars 330 may be removed from the pillar patterning, such that the holes in the mask corresponding to the one or more pillars 330 determined to be removed may not be formed. For example, the pillar patterning may include a fewer quantity of holes in the mask for the first columns 331 (e.g., corresponding to the one or more pillars 330 determined to be removed) and a greater quantity of holes in the mask for other columns (e.g., the second column 332) of the arrays 325. In such examples, cavities for the one or more pillars 330 may not be formed during the etch operation (e.g., due to the mask protecting the cavities). Alternatively, the one or more pillars 330 may be removed from the first columns 331 via an etch operation (e.g., using a dry etch or a wet etch), such that the one or more pillars 330 may be formed concurrently with other pillars 330 in the array 325 and etched (e.g., by one or more etch operations) at a later stage of manufacturing. In some examples, if the one or more pillars 330 are removed from the first columns 331 via an etch operation, the resulting cavities may be filled with one or more other materials, such as a dielectric material.

In some cases, excluding the one or more pillars 330 from one or more of the arrays 325 may prevent clipping by the slit 345 (e.g., during a formation of the slit 345). For example, the one or more pillars 330 may have been otherwise clipped by the slit 345, for example, due to a degradation of the slit profile. Therefore, by excluding the one or more pillars 330, the layout 300-*a* may benefit from reduced or avoided clipping. In some examples, removing the one or more pillars 330 may be associated with preventing shorting from occurring at one or more word lines of the layout 300 (e.g., word lines 392 described with reference to FIG. 3C) that may result from the clipping.

Although the structures (e.g., pillars) and materials (e.g., stack of materials) are illustrated as being deposited in direct contact with the substrate 305, in some other examples, the layout 300-*a* may include other materials or components between the structures and materials and the substrate 305, such as interconnection or routing circuitry (e.g., access lines), control circuitry (e.g., transistors, aspects of a local memory controller, decoders, multiplexers), or other structures and materials (e.g., other structures and materials that have been processed in accordance with examples as disclosed herein), which may include various conductor, semiconductor, or dielectric materials between the structures and materials and the substrate 305. For example, the layout 300-*a* may include a layer including thin-film-transistors (TFTs) between the substrate 305 and the structures and materials, among others. In some examples, the substrate 305 itself may include such interconnection or routing circuitry.

FIG. 3B illustrates a top view of a layout 300-*b* after a second set of one or more manufacturing operations. The second set of manufacturing operations may include forming various structures and materials over the substrate 305. For example, the second set of manufacturing operations may include forming a contact region 350. In some cases, the contact region 350 may be associated with coupling control circuitry with access circuitry (e.g., word lines, bit lines) associated with the arrays 335 of pillars 340. In some examples, the contact region 350 may include one or more contacts 355 associated with accessing subsequently formed memory cells (e.g., memory cells 390). For example, the contacts 355 may be coupled with the control circuitry and be used to couple access circuitry (e.g., subsequently) formed at respective levels of the layout 300 with the control circuitry. The contacts 355 may be formed using a contact mask (e.g., a photolithography mask) such that the contact mask may include a contact patterning for etching the contacts 355. An etch operation may be performed to etch (e.g., using a dry etch or a wet etch) cavities in accordance with the contact patterning (e.g., similar to etching using the pillar patterning). A contact material (e.g., a conductive material) may be deposited into the cavities to form the contacts 355.

The second set of manufacturing operations may include forming the slit 345 at least partially through the stack of layers 310. In some cases, forming the slit 345 may include forming a slit mask (e.g., a photolithography mask) such that the slit mask may include a slit patterning for etching the slit 345. In some examples, the slit mask may be included in the contact mask. That is, a mask may include both the slit patterning and the contact patterning. Here, the slit 345 and the cavities corresponding to the contacts 355 may be formed concurrently (e.g., as part of a same etch operation). In other examples, the slit mask may be a different mask than the contact mask. Here, the slit 345 and the cavities corresponding to the contacts may be formed as part of different etch operations.

The slit patterning may expose portions of the stack of layers 310, such that the slit mask may not protect the portions stack of layers 310 below the slit patterning (e.g., along the z-direction) during an etch operation. The etch operation may be performed to etch (e.g., using a dry etch or a wet etch) the slit 345 (e.g., as a trench, a cavity) in accordance with the slit patterning. In some examples, the slit 345 may etched at least partially through the stack of layers 310 (e.g., in the z-direction, to the substrate 305) and may extend in the second direction (e.g., the y-direction).

The slit 345 may include multiple portions, where the portions may have various widths (e.g., lengths in the x-direction). For example, the slit 345 may include a portion 360 with a width 380, a portion 365 with a width 385, a portion 370 with the width 385 (e.g., approximately the width 385), and a portion 375 with the width 385 (e.g., approximately the width 385). The width 380 may be greater than the width 385. In some examples, the portion 360 may be located adjacent to the second columns 332 of the arrays 325 in the third direction (e.g., the x-direction). That is, the columns of the arrays 325 located closest to the portion 360 in the x-direction may correspond to the second columns 332. Additionally, the portion 360 may extend into an area of the stack of layers 310 where the one or more pillars 330 were excluded from the first columns 331. In the example of FIG. 3B, the area into which the portion 360 extends may be below the first columns 331 in the second direction (e.g., the y-direction). Further, the portion 360 may be located at an interface (e.g., a transition point) between the contact region 350) and the arrays 325, such that the portion 360) may extend above the contact region 350 and beneath the first columns 331 in the second direction. That is, the portion 360 of the slit 345 may begin in the second direction at or near the interface between the contact region 350 and the arrays 325 and end in the second direction beneath the first columns 331. In some examples, the portion 360 may be located at the interface based on clipping being more likely to occur at the interface. That is, in forming the slit 345, the slit 345 may be more likely to extend beyond an intended area in the x-direction (e.g., beyond the slit patterning) at or near the interface.

In some examples, the portion 365 may be located adjacent to (e.g., next to, nearest to) the arrays 335 of pillars 340 (e.g., to first columns of the arrays 335) in the third direction and may extend from the beginning of the arrays 335 along the second direction. In some examples, the portion 370) may be located adjacent to the first columns 331 of the arrays 325 in the third direction and above the pillars 330 excluded from the first columns 331 in the second direction. That is, the portion 370 may be the portion of the slit 345 located along the first columns 331 in the second direction and nearest to the first columns 331 in the third direction. In some instances, the portion 370 may extend up to the arrays 335 in the second direction. In some examples, the portion 375 may extend through the stack of layers 310 in an area of the layout 300 where the contact region 350 is located in the second direction (e.g., below the arrays 325 in the second direction).

In some instances, the width of the slit 345 may transition from the width 385 to the width 380 at the interface between the contact region 350 and the arrays 325. That is, the width of the slit 345 may change from the width 385 to the width 380 at the transition point from the portion 375 to the portion 360. In some instances, the width of the slit 345 may transition from the width 380 to the width 385 at the transition point from the portion 360 to the portion 370. It is noted that, although the transitions in the width of the slit 345 between the portion 360 and the portions 370 and 375 are depicted as immediate, these transitions in the width of the slit 345 may be gradual (e.g., ramped, curved).

The portion 360 may have a greater width than the other portions of the slit 345. In some examples, the portion 360 may have a greater width based on the first columns 331 of the arrays 325 having a fewer quantity of pillars 330 than other columns of the arrays 325 (e.g., the second columns 332). For example, the portion 360 may be selectively widened relative to other portions of the slit 345 based on the first columns 331 excluding pillars 330 adjacent to the portion 360 of the slit 345. For instance, because the first columns exclude the pillars 330 adjacent to the portion 360, the width of the slit 345 at the portion 360 may be extended without clipping (e.g., contact, exposing) any pillars 330. In some implementations, the portion 360 may have the width 380 based on the slit patterning having the width 380 at a portion of the slit mask corresponding to the portion 360 of the slit 345. Additionally, the portions 365, 370), and 375 may have the width 385 based on the slit patterning having the width 385 at portions of the slit mask corresponding to the portions 365, 370, and 375 of the slit 345.

In some cases, the portion 360 of the slit 345 may be wider to compensate for reduced structural support associated with excluding the one or more pillars 330 from the first columns 331. For example, the slit 345 may be subsequently filled with a dielectric material (e.g., a dielectric material 347 as described with reference to FIG. 3C), and the width 380 of the portion 360 may accommodate a greater quantity of dielectric material to be deposited in the slit 345, thereby increasing the structural support provided by the dielectric material. In some cases, the width 380 may be determined such that there is an increased margin between the slit 345 and the pillars 330 of the second columns 332 than between the slit 345 and the pillars 330 of the first columns 331. Accordingly, the slit 345 may have a greater clearance in the third direction between the slit 345 and the pillars 330 of the second columns 332 than the pillars 330 of the first columns 331. This may reduce the likelihood that clipping of the pillars 330 of the second columns 332 occurs, for example, if the slit profile at the interface between the contact region 350 and the arrays 325 degrades. In accordance with examples as described herein, excluding the one or more pillars 330 and widening the slit 345 may prevent clipping, thereby preventing shorting (e.g., word line shorting resulting from clipping) while maintaining structural support at the layout 300-*b*.

FIG. 3C illustrates a top view and a cross-sectional view (e.g., at Section B-B) of a layout 300-*c* after a third set of one or more manufacturing operations. The third set of manufacturing operations may include forming various structures and materials over the substrate 305. For example, the third set of manufacturing operations may include forming word lines 392 associated with the arrays 335 of pillars 340 (e.g., word lines 265). In some examples, forming the word lines 392 may include removing (e.g., etching) the sacrificial material 315 (e.g., nitride material) from the stack of layers 310. For example, the layers of sacrificial material 315 may be removed (e.g., etched) from between the layers of dielectric material 320. In some examples, conductive material associated with the word lines 392 may be at least partially deposited in voids formed from removing the sacrificial material 315 from the stack of layers 310. For example, the word lines 392 may be formed at layers between the dielectric material 320 and may extend some distance along the third direction towards the pillars 340. In some implementations, the word lines 392 may be parallel to the substrate 305 and extend along the second direction.

In some cases, the third set of manufacturing operations may include forming memory cells 390 associated with the arrays 335 of pillars 340. In some examples, forming the memory cells 390 may include forming the memory cells 390 between dielectric materials 322 (e.g., a dielectric material 322-*a* and dielectric material 322-*b*). For example, as described with reference to FIG. 3A, one or more dielectric materials and sacrificial materials may be deposited in cavities corresponding to the pillars 340 in addition to the pillar material corresponding to the pillars 340. In some examples, dielectric materials 322-*a* and 322-*b* may be deposited in the cavities, and a sacrificial material may be deposited such that it is located between the dielectric materials 322 (e.g., the dielectric material 322-*b* may be deposited, followed by the sacrificial material, followed by the dielectric material 322-*a*, followed by the pillar 340). To form the memory cells 390, the sacrificial material may be removed (e.g., etched, exhumed), and memory cells 390 may be formed at locations of the removed sacrificial material between the word lines 392 and the pillars 340 in the xy-plane. Dielectric material (e.g., dielectric material 320) may be formed at locations of the removed sacrificial material where memory cells 390 are not formed (e.g., between memory cells 390, below and/or above the memory cells 390 in the z-direction). It is noted that the dielectric materials 322 are not shown in the top view of the layout 300-*c* for illustrative clarity.

In some cases, the slit 345 may be used to form the word lines 392, the memory cells 390, or a combination thereof. The slit 345 may provide access to the layers of the stack of layers 310 such that manufacturing operations may be performed at the layers. For example, the slit 345 may provide access for the layers of sacrificial material 315 to be removed such that the word lines 392 may be formed in the resulting voids.

The third set of manufacturing operations may include depositing a dielectric material 347 in the slit 345. The dielectric material 347 may be the same as or different from the dielectric material 320 in the stack of layers 310. In some cases, the dielectric material 347 may have similar portions as described in reference to the slit 345 in FIG. 3B. For instance, the width (e.g., along the x-direction) of the dielectric material 347 may be determined by the width of the slit 345. For example, the dielectric material 347 in the slit 345 may have at least a portion 361 having a width 380 and portions 366, 371, and 376 having a width 385 (e.g., approximately width 385), where the width 380 is greater than the width 385.

In some examples, the portion 361 may coincide with the portion 360 of the slit 345, and the portions 366, 371, and 376 of the dielectric material 347 may coincide with the portions 365, 370, and 375 of the slit 345, respectively. For example, the portion 361 of may be located adjacent to the second columns 332 of the arrays 325 in the third direction (e.g., the x-direction), where the one or more pillars 330 were excluded from the first columns 331, and extend into an area of the stack of layers 310 below the first columns 331 in the second direction (e.g., the y-direction). Further, the portion 361 may be located at the interface between the contact region 350 and the arrays 325. Additionally, the portion 366 may be located adjacent to the arrays 335 (e.g., to first columns of the arrays 335), the portion 371 may be located adjacent to the first columns 331 of the arrays 325 in the third direction and above the pillars 330 excluded from the first columns 331 in the second direction (e.g., and extend up to the arrays 335 in the second direction), and the portion 376 may be located in the area of the layout 300 where the contact region 350 is located in the second direction.

Based on being deposited in the portions of the slit 345, the width of the dielectric material 347 may similarly transition between the width 380 and the width 385. For example, the dielectric material 347 may have a greater width adjacent to the second columns 332 than the first columns 331, among other regions where the width of the slit 345 is greater than others. In some examples, the portion 361 of the dielectric material 347 may have a greater width based on the first columns 331 of the arrays 325 having a fewer quantity of pillars 330 than other columns of the arrays 325 (e.g., the second columns 332). For example, the portion 361 may have a greater width based on the first columns 331 excluding pillars 330 adjacent to the portion 361 of the dielectric material 347, thereby accommodating a greater width of the slit 345 at the portion 360.

The dielectric material 347 may at least partially compensate for the structural support lost because of the exclusion of the one or more pillars from one or more of the first columns 331. For example, the dielectric material 347 may provide a greater quantity of structural support to the layout 300 based on having a greater width at the portion 361, thereby at least partially compensating for the lost structural support. As such, the one or more pillars 330 may be excluded to prevent clipping while maintaining sufficient structural support at the layout 300-*c*.

Figure 4:
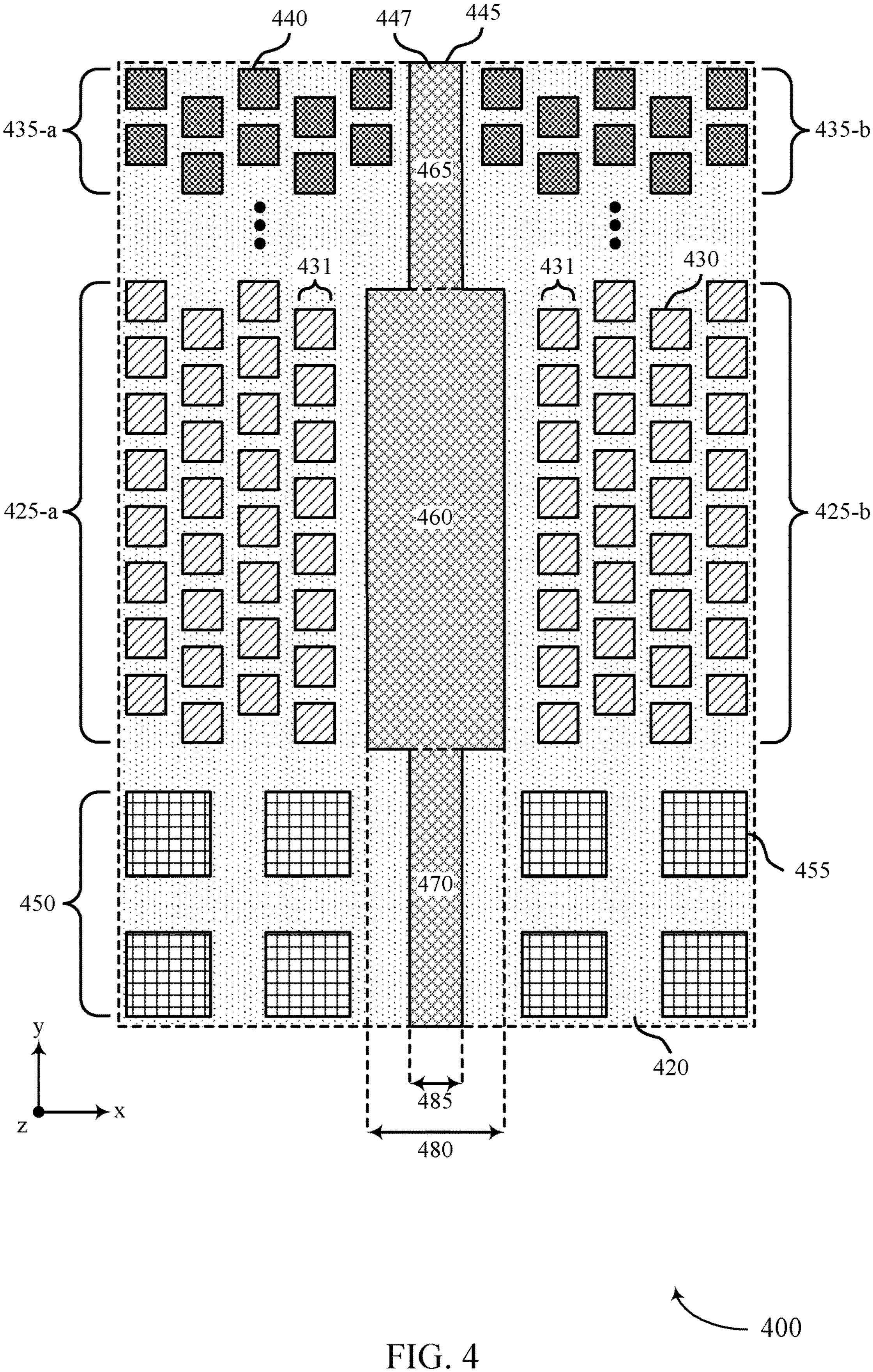
FIG. 4 illustrates an example of a memory architecture that supports three-dimensional memory array formation techniques in accordance with examples as disclosed herein.

FIG. 4 illustrates an example of a layout 400 that supports three-dimensional memory array formation techniques in accordance with examples as disclosed herein. FIG. 4, may implement aspects of the layout 300-*c*, as described with reference to FIG. 3C. Although some elements of a set of elements (e.g., an array of elements) are included in FIG. 4, some elements may be omitted for the sake of visibility and clarity of the depicted elements. Moreover, although some elements included in FIG. 4 are labeled with reference numbers, some other corresponding elements are not labeled, though they are the same or would be understood to be similar. FIG. 4 illustrates the layout 400 from a top view in an xy-plane, which may be described with reference to an x-direction, ay-direction, and a z-direction, as illustrated. Although the layout 400 illustrates examples of certain relative dimensions and quantities of various features, aspects of the layout 400 may be implemented with other relative dimensions or quantities of such features in accordance with examples as disclosed herein. The layout 400 described herein may be associated with preventing pillars of the layout 400 from being clipped by an etch operation, while maintaining structural integrity of the layout 400.

The layout 400 may include various structures and materials formed over a substrate as described with reference to FIGS. 3A through 3C. For example, the layout 400 may include arrays 425 (e.g., array 425-*a*, array 425-*b*) of pillars 430 and arrays 435 (e.g., array 435-*a*, array 435-*b*) of pillars 440, which may be respective examples of arrays 325 of pillars 330 and arrays 335 of pillars 340 described with reference to FIGS. 3A through 3C. Additionally, the layout 400 may include a contact region 450 that includes contacts 455, which may be examples of a contact region 350 and contact 355 described with reference to FIGS. 3A through 3C. The layout 400 may further include a dielectric material 447 formed in a slit 445, which may be examples of a dielectric material 347 and a slit 345 described with reference to FIGS. 3A through 3C. The layout may also include a dielectric material 420, which may be an example of a dielectric material 320 described with reference to FIGS. 3A through 3C.

One or more of the arrays 425 may be formed to exclude pillars 430 such that clipping may be prevented as described herein. In the example of FIG. 4, one or more columns of pillars 430 of one or more of the arrays 425 may be excluded, such that second columns 431 may be adjacent to the dielectric material 447 in the third direction. As a result, a quantity of columns of pillars 430 included in an array 425 may be less than a quantity of columns of pillars 440 included in an array 435.

In some cases, the dielectric material 447 may have a width 480 at a portion 460 of the slit 445 and a width 485 at portions 465 and 470 of the slit 445, where the width 480 is greater than the width 485. In some examples, the portion 460 of the slit may be adjacent to the second columns 431 in the third direction, and may extend from an interface at the transition point between the arrays 425 and the contact region to the arrays 435 in the second direction. For example, the portion 360 of the slit may extend the length of the arrays 425 in the second direction, such that the dielectric material 447 may have the width 480 for the length of the arrays 425. In some examples, the portion 465 of the slit 445 may be adjacent to first columns of the arrays 435 in the third direction and may extend the length of the array's 435 in the second direction, such that the dielectric material 447 may have the width 485 for the length of the arrays 435. In some cases, the width 480 being greater than the width 485 may be based on the one or more of the columns of pillars 430 being excluded (e.g., being removed, not being formed). For example, the exclusion of one or more columns of pillars 430 may enable the slit 445 to be selectively widened at the portion 460 while avoiding clipping.

Figure 5:
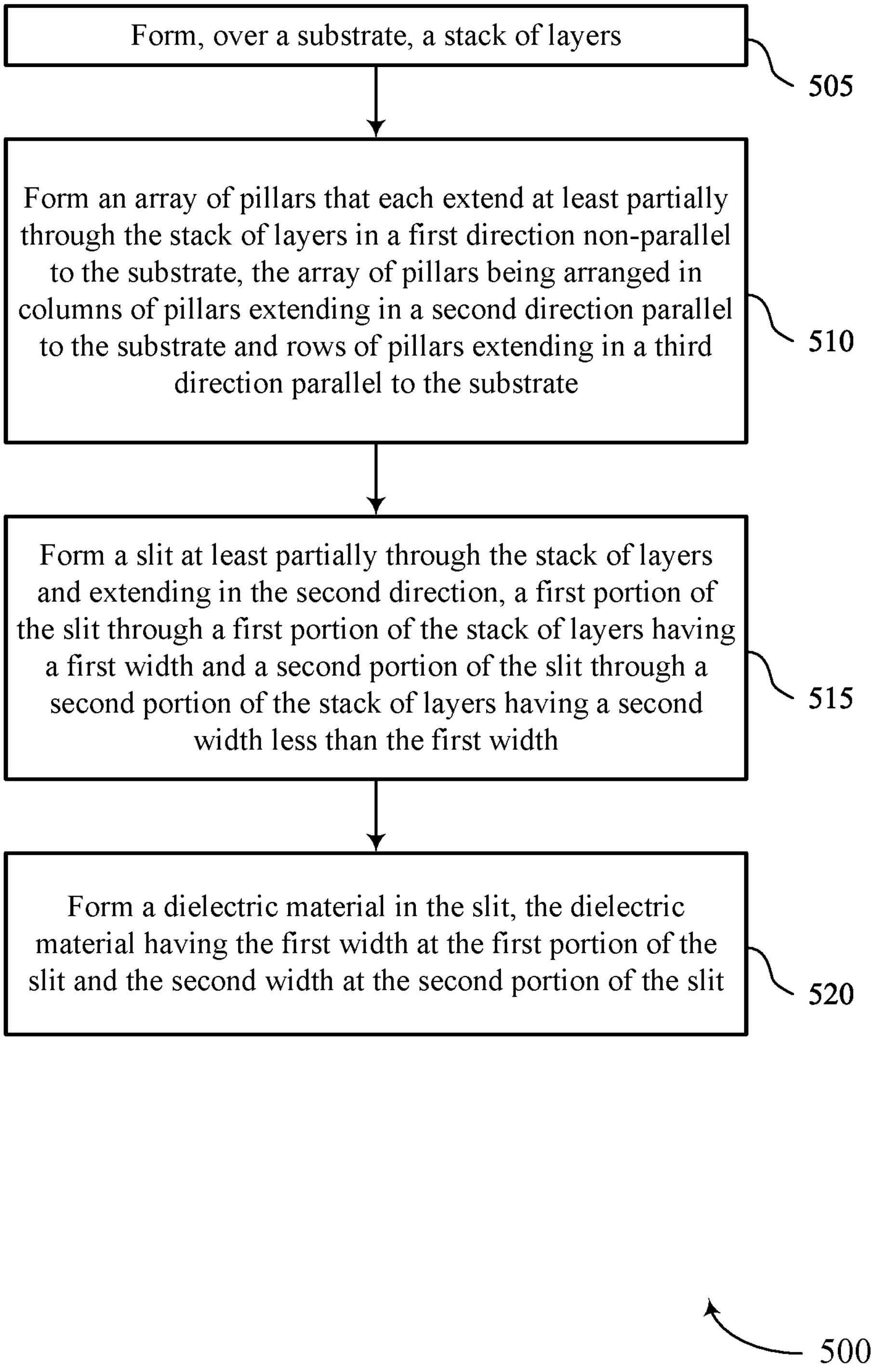
FIG. 5 shows a flowchart illustrating a method or methods that support three-dimensional memory array formation techniques in accordance with examples as disclosed herein.

FIG. 5 shows a flowchart illustrating a method or methods 500 that support three-dimensional memory array formation techniques in accordance with examples as disclosed herein. The operations of method 500 may be implemented by a manufacturing system or one or more controllers associated with a manufacturing system. In some examples, one or more controllers may execute a set of instructions to control one or more functional elements of the manufacturing system to perform the described functions. Additionally, or alternatively, one or more controllers may perform aspects of the described functions using special-purpose hardware.

At 505, the method may include forming, over a substrate, a stack of layers. The operations of 505 may be performed in accordance with examples as disclosed herein.

At 510, the method may include forming an array of pillars that each extend at least partially through the stack of layers in a first direction non-parallel to the substrate, the array of pillars being arranged in columns of pillars extending in a second direction parallel to the substrate and rows of pillars extending in a third direction parallel to the substrate. The operations of 510 may be performed in accordance with examples as disclosed herein.

At 515, the method may include forming a slit at least partially through the stack of layers and extending in the second direction, a first portion of the slit through a first portion of the stack of layers having a first width and a second portion of the slit through a second portion of the stack of layers having a second width less than the first width. The operations of 515 may be performed in accordance with examples as disclosed herein.

At 520, the method may include forming a dielectric material in the slit, the dielectric material having the first width at the first portion of the slit and the second width at the second portion of the slit. The operations of 520 may be performed in accordance with examples as disclosed herein.

In some examples, an apparatus (e.g., a manufacturing system) as described herein may perform a method or methods, such as the method 500. The apparatus may include features, circuitry, logic, means, or instructions (e.g., a non-transitory computer-readable medium storing instructions executable by one or more controllers to control one or more functional elements of the manufacturing system), or any combination thereof for performing the following aspects of the present disclosure:

Aspect 1: A method or apparatus including operations, features, circuitry, logic, means, or instructions, or any combination thereof for forming, over a substrate, a stack of layers: forming an array of pillars that each extend at least partially through the stack of layers in a first direction non-parallel to the substrate, the array of pillars being arranged in columns of pillars extending in a second direction parallel to the substrate and rows of pillars extending in a third direction parallel to the substrate: forming a slit at least partially through the stack of layers and extending in the second direction, a first portion of the slit through a first portion of the stack of layers having a first width and a second portion of the slit through a second portion of the stack of layers having a second width less than the first width: and forming a dielectric material in the slit, the dielectric material having the first width at the first portion of the slit and the second width at the second portion of the slit.

Aspect 2: The method or apparatus of aspect 1, where forming the array of pillars includes operations, features, circuitry, logic, means, or instructions, or any combination thereof for forming a first column of pillars including a first quantity of pillars and a second column of pillars including a second quantity of pillars that is greater than the first quantity of pillars, where the first width is greater than the second width based at least in part on the first quantity of pillars being less than the second quantity of pillars.

Aspect 3: The method or apparatus of aspect 2, where forming the array of pillars includes operations, features, circuitry, logic, means, or instructions, or any combination thereof for forming a mask including a pillar patterning for the array of pillars over the stack of layers, where the pillar patterning includes the first column of pillars and the second column of pillars: etching an array of cavities at least partially through the stack of layers in accordance with the pillar patterning: and forming the array of pillars in the array of cavities.

Aspect 4: The method or apparatus of any of aspects 2 through 3, where forming the slit includes operations, features, circuitry, logic, means, or instructions, or any combination thereof for forming the first portion of the slit to extend into an area of the stack of layers below the first column of pillars in the second direction and adjacent to the second column of pillars in the third direction based at least in part on the first quantity of pillars being less than the second quantity of pillars.

Aspect 5: The method or apparatus of any of aspects 2 and 4, where forming the array of pillars includes operations, features, circuitry, logic, means, or instructions, or any combination thereof for removing a subset of pillars of the first column of pillars, where the first quantity of pillars is less than the second quantity of pillars based at least in part on removing the subset of pillars.

Aspect 6: The method or apparatus of any of aspects 2 through 5, where forming the slit includes operations, features, circuitry, logic, means, or instructions, or any combination thereof for forming the slit adjacent to the array of pillars in the third direction, where the first column of pillars excludes pillars adjacent to the first portion of the slit and includes pillars adjacent to the second portion of the slit.

Aspect 7: The method or apparatus of any of aspects 1 through 6, where forming the slit includes operations, features, circuitry, logic, means, or instructions, or any combination thereof for concurrently etching the first portion of the stack of layers and the second portion of the stack of layers.

Aspect 8: The method or apparatus of aspect 7, further including operations, features, circuitry, logic, means, or instructions, or any combination thereof for forming a mask over the stack of layers excluding the first portion of the stack of layers and the second portion of the stack of layers, where the first portion of the slit is formed through the first portion of the stack of layers and the second portion of the slit is formed through the second portion of the stack of layers based at least in part on the mask.

Aspect 9: The method or apparatus of any of aspects 1 through 8, further including operations, features, circuitry, logic, means, or instructions, or any combination thereof for forming a contact region including a plurality of contacts associated with accessing an array of memory cells, where a width of the slit transitions from the second width to the first width at an interface between the contact region and the array of pillars.

Aspect 10: The method or apparatus of any of aspects 1 and 7 through 9, where forming the slit includes operations, features, circuitry, logic, means, or instructions, or any combination thereof for forming the first portion of the slit adjacent to the array of pillars, the first portion of the slit extending a length of the array of pillars in the second direction.

Aspect 11: The method or apparatus of any of aspects 1 through 10, where the pillars in the array of pillars are dummy pillars associated with providing structural support to the stack of layers.

Aspect 12: The method or apparatus of any of aspects 1 through 11, further including operations, features, circuitry, logic, means, or instructions, or any combination thereof for forming a second array of pillars that each extend at least partially through the stack of layers in the first direction: removing, via the slit, a plurality of layers of the stack of layers: forming, via the slit, a plurality of word lines within locations of the removed plurality of layers: and forming, via the slit, an array of memory cells within the locations of the removed plurality of layers, the array of memory cells including a plurality of levels of memory cells, where each memory cell of the plurality of levels of memory cells are coupled with a respective word line of the plurality of word lines and a pillar of the second array of pillars, and where the dielectric material is formed in the slit after the array of memory cells is formed.

It should be noted that the described methods include possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 13: An apparatus, including: a substrate: a stack of materials over the substrate and including a plurality of levels of memory cells: an array of pillars over the substrate and extending at least partially through the stack of materials in a first direction non-parallel to the substrate, the array of pillars configured to provide structural support to the plurality of levels of memory cells, the array of pillars arranged in columns of pillars extending in a second direction parallel to the substrate and rows of pillars extending in a third direction parallel to the substrate: and a dielectric material located in a slit through the stack of materials and extending in the second direction, a first portion of the slit through a first portion of the stack of materials having a first width and a second portion of the slit through a second portion of the stack of materials having a second width, the dielectric material having the first width at the first portion of the slit and the second width at the second portion of the slit.

Aspect 14: The apparatus of aspect 13, where the array of pillars includes: a first column of pillars including a first quantity of pillars: and a second column of pillars including a second quantity of pillars that is greater than the first quantity of pillars, where the first width is greater than the second width based at least in part on the first quantity of pillars being less than the second quantity of pillars.

Aspect 15: The apparatus of aspect 14, where the dielectric material extends into an area of the stack of materials below the first column of pillars in the second direction and adjacent to the second column of pillars in the third direction based at least in part on the first quantity of pillars being less than the second quantity of pillars.

Aspect 16: The apparatus of any of aspects 14 through 15, where: the dielectric material is adjacent to the array of pillars in the third direction, and the first column of pillars excludes pillars adjacent to the dielectric material located in the first portion of the slit and includes pillars adjacent to the dielectric material located in the second portion of the slit.

Aspect 17: The apparatus of any of aspects 13 through 16, further including: a contact region including a plurality of contacts coupled with control circuitry configured to access the plurality of levels of memory cells, where a width of the dielectric material transitions from the second width to the first width at an interface between the contact region and the array of pillars.

Aspect 18: The apparatus of any of aspects 13 and 17, where the dielectric material located in the first portion of the slit is located adjacent to the array of pillars and extends a length of the array of pillars in the second direction.

Aspect 19: The apparatus of any of aspects 13 through 18, further including: a second array of pillars that each extend at least partially through the stack of materials in the first direction: and a plurality of word lines included in the stack of materials, where each memory cell of the plurality of levels of memory cells are coupled with a respective word line of the plurality of word lines and a pillar of the second array of pillars.

Aspect 20: The method of any of aspects 13 through 19, where the first width corresponds to a first length of the slit in the third direction and the second width corresponds to a second length of the slit in the third direction.

An apparatus is described. The following provides an overview of aspects of the apparatus as described herein:

Aspect 21: An apparatus, including: an array of first pillars extending through a plurality of levels of memory cells, each first pillar configured to couple with one or more memory cells at each level of the plurality of levels of memory cells: an array of second pillars associated with providing structural support for the array of first pillars, the array of second pillars arranged in columns of second pillars extending in a first direction and rows of second pillars extending in a second direction: and a dielectric material located adjacent to the array of first pillars and the array of second pillars and extending in the first direction, a first width of a first portion the dielectric material that is adjacent to the array of first pillars being less than a second width of a second portion of the dielectric material that is adjacent to the array of second pillars.

Aspect 22: The apparatus of aspect 21, where the array of second pillars includes: a first column of second pillars including a first quantity of second pillars: and a second column of second pillars including a second quantity of second pillars that is greater than the first quantity of second pillars where the first width is less than the second width based at least in part on the first quantity of second pillars being less than the second quantity of second pillars.

Aspect 23: The apparatus of aspect 22, where: the first column of second pillars excludes second pillars adjacent to the first portion of the dielectric material and includes second pillars adjacent to a third portion of the dielectric material adjacent to the array of second pillars and having the first width.

Aspect 24: The apparatus of aspect 21, where: the array of first pillars are arranged in columns of first pillars extending in the first direction and rows of second pillars extending in the second direction, the array of first pillars including a first quantity of columns of first pillars, the array of second pillars includes a second quantity of columns of second pillars that is less than the first quantity of columns of first pillars, and the second width is greater than the first width based at least in part on the second quantity of columns of second pillars being less than the first quantity of columns of first pillars.

Aspect 25: The apparatus of any of aspects 21 through 24, further including: a contact region including a plurality of contacts coupled with control circuitry configured to access the plurality of levels of memory cells, where the array of second pillars is located between the array of first pillars and the contact region in the first direction, and where the width of the dielectric material transitions from the first width to the second width at an interface between the contact region and the array of second pillars.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal: however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, or materials, or combinations thereof. In some examples, one layer or level may be composed of two or more sublayers or sublevels.

The terms "if," "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The term "in response to" may refer to one condition or action occurring at least partially, if not fully, as a result of a previous condition or action. For example, a first condition or action may be performed and second condition or action may at least partially occur as a result of the previous condition or action occurring (whether directly after or after one or more other intermediate conditions or actions occurring after the first condition or action).

Additionally, the terms "directly in response to" or "in direct response to" may refer to one condition or action occurring as a direct result of a previous condition or action. In some examples, a first condition or action may be performed and second condition or action may occur directly as a result of the previous condition or action occurring independent of whether other conditions or actions occur. In some examples, a first condition or action may be performed and second condition or action may occur directly as a result of the previous condition or action occurring, such that no other intermediate conditions or actions occur between the earlier condition or action and the second condition or action or a limited quantity of one or more intermediate steps or actions occur between the earlier condition or action and the second condition or action. Any condition or action described herein as being performed "based on," "based at least in part on," or "in response to" some other step, action, event, or condition may additionally, or alternatively (e.g., in an alternative example), be performed "in direct response to" or "directly in response to" such other condition or action unless otherwise specified.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary." used herein means "serving as an example, instance, or illustration" and not "preferred" or "advantageous over other examples." The detailed description includes specific details to provide an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, described functions can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:

forming, over a substrate, a stack of layers;

forming an array of pillars that each extend at least partially through the stack of layers in a first direction non-parallel to the substrate, the array of pillars being arranged in columns of pillars extending in a second direction parallel to the substrate and rows of pillars extending in a third direction parallel to the substrate;

forming a slit at least partially through the stack of layers and extending in the second direction, a first portion of the slit through a first portion of the stack of layers having a first width and a second portion of the slit through a second portion of the stack of layers having a second width less than the first width, wherein the first width is formed where extension of the slit, beyond an intended profile of the slit, is likely to occur; and forming a dielectric material in the slit, the dielectric material having the first width at the first portion of the slit and the second width at the second portion of the slit.

2. The method of claim 1, wherein forming the array of pillars comprises:

forming a first column of pillars comprising a first quantity of pillars and a second column of pillars comprising a second quantity of pillars that is greater than the first quantity of pillars, wherein the first width is greater than the second width based at least in part on the first quantity of pillars being less than the second quantity of pillars.

3. The method of claim 2, wherein forming the array of pillars comprises:

forming a mask comprising a pillar patterning for the array of pillars over the stack of layers, wherein the pillar patterning comprises the first column of pillars and the second column of pillars;

etching an array of cavities at least partially through the stack of layers in accordance with the pillar patterning; and forming the array of pillars in the array of cavities.

4. The method of claim 2, wherein forming the slit comprises:

forming the first portion of the slit to extend into an area of the stack of layers below the first column of pillars in the second direction and adjacent to the second column of pillars in the third direction based at least in part on the first quantity of pillars being less than the second quantity of pillars.

5. The method of claim 2, wherein forming the array of pillars comprises:

removing a subset of pillars of the first column of pillars, wherein the first quantity of pillars is less than the second quantity of pillars based at least in part on removing the subset of pillars.

6. The method of claim 2, wherein forming the slit comprises:

forming the slit adjacent to the array of pillars in the third direction, wherein the first column of pillars excludes pillars adjacent to the first portion of the slit and includes pillars adjacent to the second portion of the slit.

7. The method of claim 1, wherein forming the slit comprises:

concurrently etching the first portion of the stack of layers and the second portion of the stack of layers.

8. The method of claim 7, further comprising:

forming a mask over the stack of layers excluding the first portion of the stack of layers and the second portion of the stack of layers, wherein the first portion of the slit is formed through the first portion of the stack of layers and the second portion of the slit is formed through the second portion of the stack of layers based at least in part on the mask.

9. The method of claim 1, further comprising:

forming a contact region comprising a plurality of contacts associated with accessing an array of memory cells, wherein a width of the slit transitions from the second width to the first width at an interface between the contact region and the array of pillars.

10. The method of claim 1, wherein forming the slit comprises:

forming the first portion of the slit adjacent to the array of pillars, the first portion of the slit extending a length of the array of pillars in the second direction.

11. The method of claim 1, wherein the pillars in the array of pillars are dummy pillars associated with providing structural support to the stack of layers.

12. A method, comprising:

forming, over a substrate, a stack of layers;

forming an array of pillars that each extend at least partially through the stack of layers in a first direction non-parallel to the substrate, the array of pillars being arranged in columns of pillars extending in a second direction parallel to the substrate and rows of pillars extending in a third direction parallel to the substrate;

forming a slit at least partially through the stack of layers and extending in the second direction, a first portion of the slit through a first portion of the stack of layers having a first width and a second portion of the slit through a second portion of the stack of layers having a second width less than the first width;

forming a dielectric material in the slit, the dielectric material having the first width at the first portion of the slit and the second width at the second portion of the slit;

forming a second array of pillars that each extend at least partially through the stack of layers in the first direction;

removing, via the slit, a plurality of layers of the stack of layers;

forming, via the slit, a plurality of word lines within locations of the removed plurality of layers; and forming, via the slit, an array of memory cells within the locations of the removed plurality of layers, the array of memory cells comprising a plurality of levels of memory cells, wherein each memory cell of the plurality of levels of memory cells is coupled with a respective word line of the plurality of word lines and a pillar of the second array of pillars, and wherein the dielectric material is formed in the slit after the array of memory cells is formed.

13. An apparatus, comprising:

a substrate;

a stack of materials over the substrate and comprising a plurality of levels of memory cells;

an array of pillars over the substrate and extending at least partially through the stack of materials in a first direction non-parallel to the substrate, the array of pillars configured to provide structural support to the plurality of levels of memory cells, the array of pillars arranged in columns of pillars extending in a second direction parallel to the substrate and rows of pillars extending in a third direction parallel to the substrate;

a dielectric material located in a slit through the stack of materials and extending in the second direction, a first portion of the slit through a first portion of the stack of materials having a first width and a second portion of the slit through a second portion of the stack of materials having a second width, the dielectric material having the first width at the first portion of the slit and the second width at the second portion of the slit; and a contact region comprising a plurality of contacts coupled with control circuitry configured to access the plurality of levels of memory cells, wherein a width of the dielectric material transitions from the second width to the first width at an interface between the contact region and the array of pillars.

14. The apparatus of claim 13, wherein the array of pillars comprises:

a first column of pillars comprising a first quantity of pillars; and a second column of pillars comprising a second quantity of pillars that is greater than the first quantity of pillars, wherein the first width is greater than the second width based at least in part on the first quantity of pillars being less than the second quantity of pillars.

15. The apparatus of claim 13, wherein the dielectric material located in the first portion of the slit is located adjacent to the array of pillars and extends a length of the array of pillars in the second direction.

16. An apparatus, comprising:

a substrate;

a stack of materials over the substrate and comprising a plurality of levels of memory cells;

an array of pillars over the substrate and extending at least partially through the stack of materials in a first direction non-parallel to the substrate, the array of pillars configured to provide structural support to the plurality of levels of memory cells, the array of pillars arranged in columns of pillars extending in a second direction parallel to the substrate and rows of pillars extending in a third direction parallel to the substrate;

a dielectric material located in a slit through the stack of materials and extending in the second direction, a first portion of the slit through a first portion of the stack of materials having a first width and a second portion of the slit through a second portion of the stack of materials having a second width, the dielectric material having the first width at the first portion of the slit and the second width at the second portion of the slit;

a second array of pillars that each extend at least partially through the stack of materials in the first direction; and a plurality of word lines included in the stack of materials, wherein each memory cell of the plurality of levels of memory cells is coupled with a respective word line of the plurality of word lines and a pillar of the second array of pillars.

17. An apparatus, comprising:

an array of first pillars extending through a plurality of levels of memory cells, each first pillar configured to couple with one or more memory cells at each level of the plurality of levels of memory cells;

an array of second pillars associated with providing structural support for the array of first pillars, the array of second pillars arranged in columns of second pillars extending in a first direction and rows of second pillars extending in a second direction; and a dielectric material located adjacent to the array of first pillars and the array of second pillars and extending in the first direction, a first width of a first portion of the dielectric material that is adjacent to the array of first pillars being less than a second width of a second portion of the dielectric material that is adjacent to the array of second pillars.

18. The apparatus of claim 17, wherein the array of second pillars comprises:

a first column of second pillars comprising a first quantity of second pillars; and a second column of second pillars comprising a second quantity of second pillars that is greater than the first quantity of second pillars, wherein the first width is less than the second width based at least in part on the first quantity of second pillars being less than the second quantity of second pillars.

19. The apparatus of claim 17, further comprising:

a contact region comprising a plurality of contacts coupled with control circuitry configured to access the plurality of levels of memory cells, wherein the array of second pillars is located between the array of first pillars and the contact region in the first direction, and wherein the dielectric material transitions from the first width to the second width at an interface between the contact region and the array of second pillars.

* * * * *